US012793354B2

(12) United States Patent
Osokin et al.

(10) Patent No.: US 12,793,354 B2
(45) Date of Patent: Nov. 10, 2026

(54) SYSTEM FOR GENERATION OF FLOOR PLANS AND THREE-DIMENSIONAL MODELS

(71) Applicant: Occipital, Inc., Boulder, CO (US)

(72) Inventors: Daniil Osokin, Nizhny Novgorod (RU); Oleg Kazmin, Moscow Region (RU); Gleb Krivovyaz, Moscow (RU); Anton Yakubenko, Boulder, CO (US); Ivan Malin, Moscow (RU); Sergii Dubrovskyi, Kharkov (UA); Dmitry Retinskiy, Nizhny Novgorod (RU); Tatiana Khanova, Nizhny Novgorod (RU); Anna Petrovicheva, Nizhny Novgorod (RU); Denver Halbert Dash, Longmont, CO (US); Jeffrey Roger Powers, Fulshear, TX (US); Alex Schiff, San Francisco, CA (US); Dmytro Korbut, Dnipro (UA); Aleksandr Liashuk, Nizhny Novgorod (RU); Alexander Smorkalov, Nizhny Novgorod (RU); Maxim Zemlyanikin, Nizhny Novgorod (RU)

(73) Assignee: Occipital, Inc., Denver, CO (US)

( * ) Notice: Subject to any disclaimer, the term of this patent is extended or adjusted under 35 U.S.C. 154(b) by 200 days.

(21) Appl. No.: 18/675,273

(22) Filed: May 28, 2024

(65) Prior Publication Data

US 2024/0312162 A1 Sep. 19, 2024

Related U.S. Application Data

(63) Continuation of application No. 17/664,252, filed on May 20, 2022, now Pat. No. 12,026,840.

(60) Provisional application No. 63/201,997, filed on May 21, 2021.

(51) Int. Cl.
*G06T 19/00* (2011.01)
*G06F 30/13* (2020.01)
*G06T 17/20* (2006.01)

(52) U.S. Cl.
CPC ............ *G06T 19/006* (2013.01); *G06F 30/13* (2020.01); *G06T 17/20* (2013.01); *G06T 19/003* (2013.01)

(58) Field of Classification Search
None
See application file for complete search history.

(56) References Cited

U.S. PATENT DOCUMENTS

| | | | |
|---|---|---|---|
| 10,166,676 | B1 | 1/2019 | Hudson et al. |
| 10,192,115 | B1 | 1/2019 | Sheffield et al. |

(Continued)

OTHER PUBLICATIONS

Office Action for U.S. Appl. No. 17/664,252, mailed on Feb. 1, 2024, 12 pages.

(Continued)

*Primary Examiner* — Martin Mushambo
(74) *Attorney, Agent, or Firm* — Lee & Hayes, P.C.

(57) ABSTRACT

A system for generating three-dimensional models of a physical environment such as a room. In some cases, the system may utilize a two-dimensional floor, room, or house plan to generate, close and/or orthogonalize wall segments. The system may then generate a three-dimensional model by projecting the wall segments into a three-dimensional space and inserting objects.

20 Claims, 15 Drawing Sheets

(56) References Cited

U.S. PATENT DOCUMENTS

| | | | | |
|---|---|---|---|---|
| 2008/0130996 | A1* | 6/2008 | Sternby | G06V 30/347 382/187 |
| 2010/0310154 | A1 | 12/2010 | Barrois et al. | |
| 2013/0100138 | A1* | 4/2013 | Moriyama | G06T 11/23 345/442 |
| 2015/0015602 | A1 | 1/2015 | Beaudoin | |
| 2017/0193829 | A1* | 7/2017 | Bauer | G06T 17/05 |
| 2018/0075648 | A1 | 3/2018 | Moghadam et al. | |
| 2018/0188043 | A1 | 7/2018 | Chen et al. | |
| 2018/0308249 | A1 | 10/2018 | Nash et al. | |
| 2019/0033461 | A1 | 1/2019 | Wingert et al. | |
| 2019/0051052 | A1 | 2/2019 | Corazza et al. | |
| 2019/0205485 | A1* | 7/2019 | Rejeb Sfar | G06F 30/13 |
| 2019/0258251 | A1* | 8/2019 | Ditty | G05D 1/0088 |
| 2019/0279420 | A1* | 9/2019 | Moreno | G06T 17/10 |
| 2020/0282929 | A1* | 9/2020 | Kroeger | G01S 7/497 |
| 2020/0302686 | A1* | 9/2020 | Totty | G06T 7/174 |
| 2020/0341466 | A1 | 10/2020 | Pham | |
| 2020/0363202 | A1 | 11/2020 | Metzler et al. | |
| 2021/0150805 | A1* | 5/2021 | Stekovic | G06T 3/10 |
| 2021/0192099 | A1 | 6/2021 | Benromano et al. | |
| 2021/0209075 | A1* | 7/2021 | Dong | G06F 16/215 |
| 2021/0256680 | A1 | 8/2021 | Lingxi | |
| 2021/0279967 | A1 | 9/2021 | Gernoth et al. | |
| 2021/0327021 | A1* | 10/2021 | Pang | H04N 19/60 |
| 2021/0347378 | A1 | 11/2021 | Nabatchian et al. | |
| 2022/0262100 | A1 | 8/2022 | Chandler et al. | |
| 2022/0300766 | A1 | 9/2022 | Guizilini et al. | |
| 2022/0309794 | A1 | 9/2022 | Rykov et al. | |
| 2022/0375170 | A1 | 11/2022 | Osokin | |
| 2024/0312163 | A1 | 9/2024 | Osokin et al. | |

OTHER PUBLICATIONS

Office Action for U.S. Appl. No. 18/675,290, dated Mar. 12, 2026, 9 Pages.

* cited by examiner

200

RECEIVE A THREE-DIMENSIONAL SCAN OF A PHYSICAL ENVIRONMENT
202

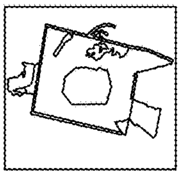

GENERATE, BASED AT LEAST IN PART ON THE THREE-DIMENSIONAL SCAN, A FIRST HEATMAP ASSOCIATED WITH PREDICTED CORNERS OF THE PHYSICAL ENVIRONMENT
204

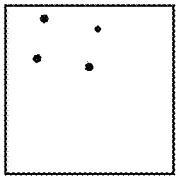

GENERATE, BASED AT LEAST IN PART ON THE THREE-DIMENSIONAL SCAN, A SECOND HEATMAP ASSOCIATED WITH PREDICTED WALLS SEGMENTS OF THE PHYSICAL ENVIRONMENT
206

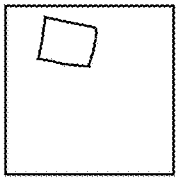

DETERMINE, BASED AT LEAST IN PART ON THE FIRST HEATMAP, PAIRS OF CANDIDATE CORNER POSITIONS
208

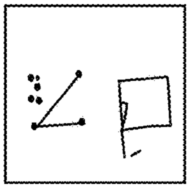

DETERMINE FOR INDIVIDUAL PAIRS, BASED AT LEAST IN PART ON THE SECOND HEATMAP, A RESPONSE VALUE REPRESENTATIVE OF A FIT BETWEEN THE PAIRS AND THE SECOND HEATMAP
210

GROUP, BASED AT LEAST IN PART ON THE RESPONSE VALUE, THE PAIRS INTO WALL SEGMENTS
212

FIG. 2

600
RECEIVE A SHELL AND A THREE-DIMENSIONAL SCAN OF A PHYSICAL ENVIRONMENT
602
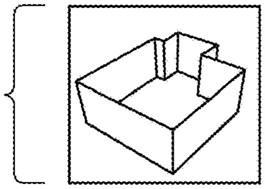
PARAMETERIZE SEGMENTS OF THE SHELL
604
PERFORM, BASED AT LEAST IN PART ON THE PARAMETERS, REFINEMENT ON THE SHELL AND/OR WALL SEGMENTS
606
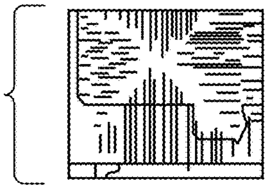
FIG. 6

SYSTEM FOR GENERATION OF FLOOR PLANS AND THREE-DIMENSIONAL MODELS

CROSS-REFERENCE TO RELATED APPLICATION(S)

This application claims priority to U.S. application Ser. No. 17/664,252 filed on May 20, 2022 and entitled "SYSTEM FOR GENERATION OF FLOOR PLANS AND THREE-DIMENSIONAL MODELS," which is a non-provisional of and claims priority to U.S. Provisional Application No. 63/201,997 filed on May 21, 2021 and entitled "SYSTEM AND METHOD FOR GENERATING A THREE-DIMENSIONAL SCENE," which are incorporated herein by in their entirety.

BACKGROUND

The presence of three-dimensional (3D) sensing and imaging is becoming more and more common in industries such as home remodeling, healthcare, printing, and augmented reality (AR). However, the three-dimensional scans are typically approximations of the physical surface and/or object resulting in discrepancies and variations in exact wall and object placement, alignment, and dimensions. Accordingly, the 3D scans may be ill suited for use in architectural or design purposes.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIG. 2 illustrates an example flow diagram showing a process for generating a three-dimensional model according to some implementations.

FIG. 6 illustrates an example flow diagram showing a process for refining a model of a physical environment based on a three-dimensional scan according to some implementations.

DETAILED DESCRIPTION

Figure 1:
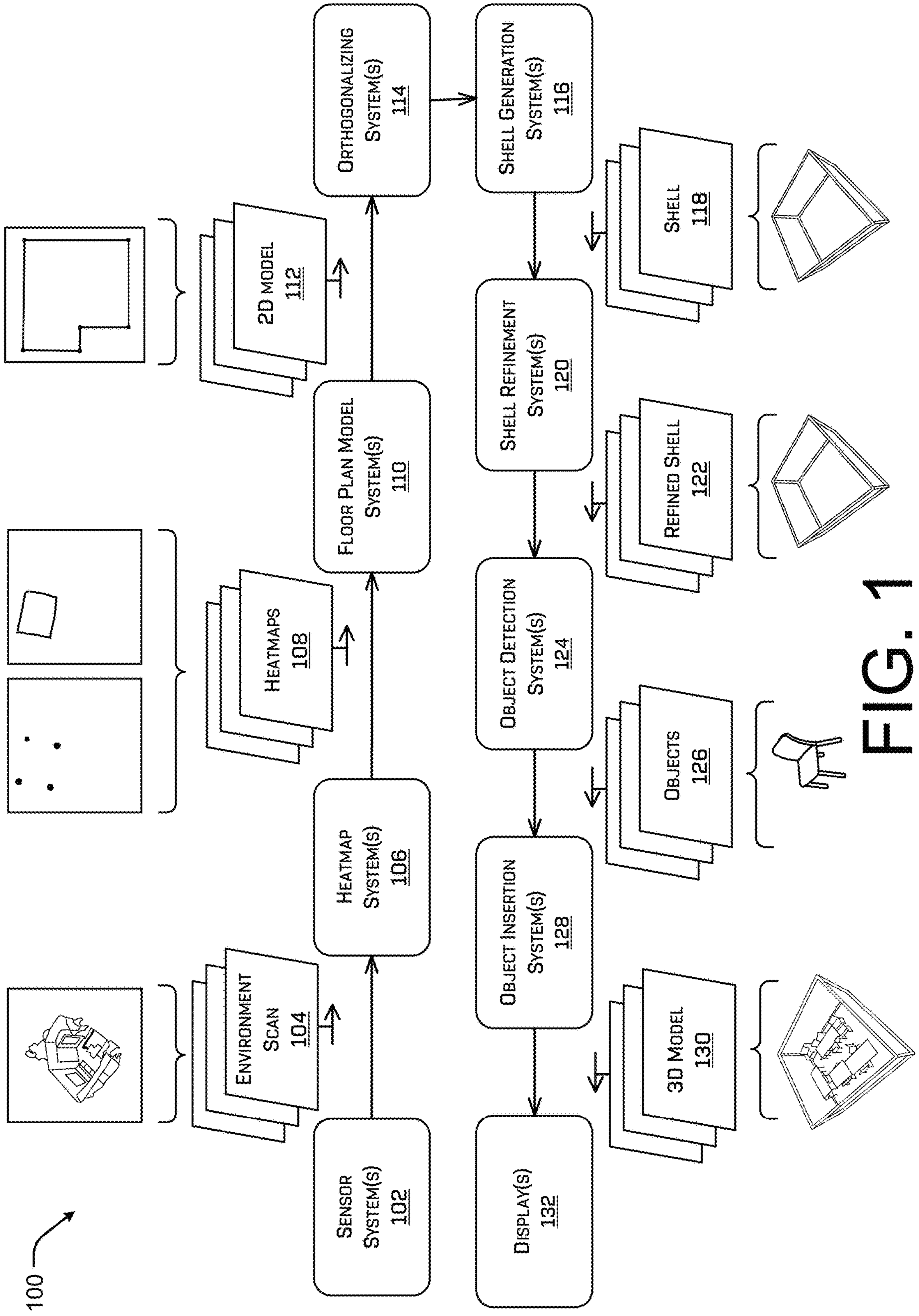
FIG. 1 is an example block diagram of a system for generating two-dimensional floor plans and three-dimensional CAD or architectural models according to some implementations.

This disclosure includes techniques and systems for generating two-dimensional floor plans of a physical environment, such as a home, office, or other building. The system may also generate 3D CAD models that may be used by architects, construction personnel, homeowners, designers, and the like to plan, review, modify, and/or otherwise review the building. In some examples, a user may scan a physical room using sensors available on many handheld electronic devices. The sensor data may include image data (e.g., photos, video, and the like), depth data, position and orientation data (e.g., IMU data, GPS data, and the like). The system may utilize the captured data to generate a 3D scan or model of the physical environment (e.g., the room). However, often the 3D scans or models generated by the handheld electronic device may include surfaces and/or objects that have discrepancies and variations in placement, alignment, and dimensions with respect to the actual physical environment. For example, the 3D scan may include gaps or holes where the physical environment was improperly scanned, unparallel walls, unconnected surfaces, uneven surfaces, and the like. Accordingly, the 3D scans may be ill suited for use as architectural or deign purposes.

The system discussed herein may be configured to receive the 3D scan of a physical environment (e.g., a room) and generate from the scan a two-dimensional floor plan. The two-dimensional floor plan may be closed (e.g., each wall segment is connected at both ends) and orthogonal (e.g., wall segments are perpendicular or parallel to each other). The system may also generate 3D models from the three-dimensional scan, three-dimensional shells, and/or two-dimensional floor plans. In some cases, the 3D model may be a semantic 3D model derived from the 3D scan, such a CAD model. The 3D models are also closed and orthogonal. In some cases, the system may also select pre-generated and/or generate accurate 3D models (e.g., again CAD models) of the objects within the physical environment and insert the 3D objects into the 3D model.

In some examples, the system may receive the 3D scan of the physical environment and input the 3D scan into one or more machine learned models and/or networks. The machine learned models and networks may be configured to output one or more 2D heatmaps representative of the physical environment. For example, the machine learned models may output a corner heatmap, a wall segment heatmap, an inside heatmap or mask, and/or an outline heatmap or mask.

In one example, using the corner heatmap, the system may determine combinations of pairs between the corners. The system may then utilize the pairs to form candidate wall segments. The system may then score each candidate wall segment by comparing the wall segment to the wall segment heatmap. The system may then select the segments having the highest response score with respect to the wall segment heatmap as the wall segments for the 2D floor plan and/or the 3D model.

In some cases, the wall segments generated using the heatmaps, as discussed above, may result in unconnected or unclosed wall segments. In these cases, the system may identify unconnected endpoints (e.g., endpoints having only one associated segment). The system may then generate pairs between the unconnected endpoints. For each pair, the system may generate one or more variant line segment that may connect the two endpoints of the pair. The system may utilize different types of line segments, such as a straight, L-shaped, and the like. In some cases, the variant line segments may be generated by rotating the line segments about one or the other of the endpoints of the pair. The system may discard any line segment that intersects with an existing line segment. For the remaining line segments, the system may generate a score based at least in part on the wall segment heatmap and insert the highest scoring segments to complete the floor plan. In some cases, if the floor plan remains unclosed, the system may generate additional variant line segments using all endpoint pairs, even if the endpoint is already fully connected (e.g., connected to two line segments). The system may then retest by determining if the variant line segments intersect existing wall segments and scoring based at least in part on the wall segment heat map.

In other cases, the system may receive the unconnected or unclosed wall segments. In these cases, the system may select or determine a trusted line segment from the existing line segments. For instance, the system may select a longest line segment as the trusted line segment. The system may then for each other line segment (e.g., other than the trusted line segment), generate segment variants by rotating around the end points of the other line segments until a variant is determined to be parallel or orthogonal to the trusted line segment. In some cases, the variant may be parallel or orthogonal if the variant is less than or equal to a threshold angle of the trusted line segment. In some examples, two or more variants may be within the threshold angle, and, in these examples, the system may score the two or more variants, for instance again, based at least in part on the wall segment heatmap.

In other cases, the system may receive the un-orthogonalized floor plan and then generate a distribution (such as a histogram) of angles between the wall segments. The system may then determine a direction vector for the model based at least in part on the distribution and perform an initial orthogonalization. For example, initially the system may adjust each wall segment to be either orthogonal to the direction vector (e.g., parallel or perpendicular to the direction vector). For example, the system may adjust each wall segment based on non-linear optimization and maximizing correspondences to one or more heatmaps.

In some cases, the segment may be orthogonal, within the initial orthogonalization, if the segment is within a threshold angle of being parallel or perpendicular to the direction vector.

Following the initial orthogonalization, the system may then perform a strict orthogonalization on the segments to fully conform the segments with the direction vector. In some cases, the strict orthogonalization may comprise setting an "axis" of the model to align with the direction vector. The system may then select a point (such as an endpoint of a segment) and determine each point of the segment which is connected to the selected point (e.g., each point along the line representing the segment). The system may then project the points on a line which passes through the selected point and at a position such that the segment is parallel to the "axis" (e.g., the direction vector). The system may then iterate through the remaining segments and either align parallel to the direction vector or to a vector perpendicular to the direction vector, for wall segments connecting parallel walls.

In some cases, the system may also refine the wall segments of a shell based on a parameterization of the segments. For example, the system may refine orthogonalized shell to 3D-scan while maintaining the shell's orthogonalization. In some cases, the system uses a non-linear optimization method to optimize several parameters and to minimize some residuals describing distance of corresponding points of the shell to 3D-scan or mesh. In some examples, optimizing parameters may represent and/or describe rotation and position in some coordinate system of the floorplan and of each segment separately. Some of segments may be fixed during the refinement process to maintain the orthogonalization of the shell. Residuals might differ from implementation to implementation and describe distance from the floorplan to 3D-scan. For example, distance from vertex of mesh to nearest floorplan segment might be considered as residual in some implementations.

In other examples, the system may generate the 2D floor plan by generating a plurality of inside heatmaps (e.g., learned heatmaps representing the interior space of the physical environment) and reconstructed segments inside heatmap. In some cases, the plurality of inside heatmaps may be generated by rotating the 3D scan and inputting the rotated 3D scan into a machine learned model. In some instances, the system may also receive from the machine learned model, in addition to the inside heatmap and segments inside and for each rotation, and a corners heatmap. In this example, the system may then compute for each rotation similarity of the inside heatmap and the outline heatmap. The system may then select the heatmap having the greatest similarity to generate the floor plan and 3D CAD models.

In some examples, the walls may be slightly misaligned with the physical environment. In these examples, the system may receive the 3D scan of the physical environment and, utilizing the scan, generate a point cloud representative of or associated with the physical environment. In some cases, the point cloud may represent the wall segments. The system may then determine a network uncertainty using the point cloud. Using the network uncertainty, the system may adjust the position of the wall segments to more closely align with the physical environment. For instance, in some cases, the system may convert each line into segments (such as using clusterization—e.g., Density-based spatial clustering of applications with noise (DBSCAN)) and extract a segment heatmap as an intersection of the line with a binary mask of the wall. The system may then filter the segments by size (e.g., segments that do not meet or exceed a length threshold may be discarded). The remaining segments may be sorted by length (e.g., larger segments have a higher rank or order than smaller segments). The system may then apply non-maximum suppression to filter smaller segments in neighborhood of the longer segments. Next, the system may orthogonalize the wall segments and close any remaining gaps using the binary map of the walls.

In some examples, once the two-dimensional floor plan is generated, the system may then select the longest wall segment to use for orthogonalization. The system may, for each other segment of the binary mask, align the other segment as parallel or orthogonal to the longest segment. The system may then extend the segments until each segment intersects with another. If there are any remaining unconnected endpoints the system may attempt to connect via an L-shaped segment (that does not intersect or cross through any existing wall segments), as discussed herein. In some examples, the system may insert, arrange, and/or add windows, doors, and the like to a 3D shell model of a physical environment. In this example, the system may receive the completed shell of the physical environment and the 3D scan. For instance, once the 2D floor plan is generated and orthogonalized, the system may render a 3D shell of the physical environment by projecting the line segments upwards by a known distance, such as the height of the room (e.g., the physical environment). Using the shell and image data (such as one or more frames of the 3D scan), the system may then add windows, doors, and the like to the shell. For instance, the system may segment and classify the image data (e.g., objects within multiple frames of the 3D scan) to identify pixels associated with the windows, doors, and the like (as well as, in some cases, other objects such as furniture).

As an illustrative example, the segmentation and classification may be derived from the 3D scan by means of selecting various viewpoints within the scan and then generating the "virtual views" (by projecting the 3D scan onto the image plane using the selected camera positions and intrinsic parameters). In some cases, this allows for a more controlled way of generating 2D image data for segmentation, classification, and/or other machine learning techniques. For example, there might be no single frame of the original image data in which a door or some other architectural element is fully visible. This would then cause problems for classification. But the system may generate 2D images from the 3D scan itself and, thereby, choose such camera positions and field of view that the door is fully visible, and that the whole scan is "covered" by these generated virtual views.

The system may then generate, using the pixels of a selected object class (such as windows), a response map. In some cases, the system may label pixels associated with each object of the class (e.g., if the physical environment included two or more windows). The system may then, based on the response map, determine contours for each object. The system may then project the contours into a common 3D space and determine an intersection between bounding boxes around pixels of an object instance in the 3D space. In some cases, the system may merge pixels of two or more contours when the intersection meets or exceeds an intersection threshold. In some cases, the contours are also of the same class and/or instance of the object (as determined during segmentation and classification). The system may then project the merged pixels onto the shell to position and insert the object (e.g., window or door) into the 3D model.

In some cases, a door may be open when the 3D scan was captured. In these cases, the door may have two positions for insertion into the wall of the shell (e.g., to either side of the position where the door connects to the wall). In these cases, the system may determine the two closest positions on the shell to the door (such as in front of the open door and behind the open door). The system may then determine if a hole in the 3D scan exists. For instance, the hole may be caused by an opening (e.g., the door opening) or the door itself obstructing the area behind the door during the 3D capture process. Accordingly, the system may detect a first hole and/or a second hole. If only one hole is detected, the system may assign the hole as the door opening and position the door, accordingly, within the opening. However, if two holes exist (e.g., the first hole in front of the door and second hole behind the door), the system may determine a percentage or amount of floor that exists in the 3D scan and select the hole that has the larger percentage or amount of floor. For example, if the hole is caused by an obstruction of the 3D capture by the door, the floor space will also be represented as a hole, while if the hole is a door opening the floor is more likely to exist and/or be represented in the 3D scan.

In some examples, in addition to doors and windows, the system may determine objects within the physical environment, such as furniture. In this example, the system may receive the completed shell of the physical environment and the 3D scan. The system may detect the object within the 3D scan, such as via one or more machine learned models or networks configured to segment and classify the objects. The system may also generate a point cloud associated with the object and determine an object model for use as the object in the shell based at least in part on the point cloud. The system may then determine an alignment (e.g., a scale, rotation, and translation) of the object model within the shell. The system may then project, based at least in part on the alignment, the object model into the shell, thereby placing the object within the shell.

As discussed above, the system may select an object model based at least in part on a point cloud of the object. In these cases, the system may be trained using point cloud representation associated with a 3D model or CAD model of the real physical object. To train the model, the system may receive an object model, such as a CAD model of a real physical object. The system may generate, based on the object model, a first point cloud representation. The system may then densify the point cloud to meet or exceed a density threshold. The system may then generate a plurality of partial point clouds based on the first point cloud, a defined path (e.g., a capture path about the object point cloud), and defined camera intrinsic and extrinsic matrices. Each of the capture positions may then generate one of a set of second point clouds. These sets of second point clouds may be partially obstructed or otherwise imperfect. The system may then combine the set of second point clouds to generate training point clouds that may be used by the system to train machine learned models to detect or match CAD models to point clouds of objects generated from 3D scans.

In some examples, the system may also determine planar surfaces when generating the shell. In this example, the system may receive an input image, such a still 2D image generated from a 3D scan. In some cases, the system may perform semantic segmentation, line segmentation, and segmentation by normals to generate three output images associated with the input image. The system may then determine an intersection between contours detected at the three output images and using the intersection determine one or more planar regions associated with the input image.

FIG. 1 is an example block diagram of a system 100 for generating two-dimensional floor plans and three-dimensional CAD or architectural models according to some implementations. In the current example, a sensor system 102 may generate an environment scan 104 (such as a 3D scan) of the physical environment. In some cases, the user may utilize a hand-held electronic device equipped with one or more image capture devices to scan the physical environment.

The environmental scan may be provided to a heatmap system 106. The heatmap system 106 may be configured to generate one or more heatmaps 108 of the physical environment based at least in part on the environment scan 104. In some cases, the heatmaps 108 may be a top down view of the physical environment and represent various portions of the surfaces and/or objects associated or captured as part of the environment scan 104. For example, the heatmap system 106 may generate a wall segment heatmap, a corner heatmap, an inside heatmap, an outline heatmap, and the like. In some cases, the heatmap system 106 may include one or more machine learned models and/or networks that are configured to receive the scan 104 as an input and output the heatmaps 108 in response.

A floor plan model system 110 may be configured to receive both the environment scan 104 and the one or more heatmaps 108. The floor plan model system 110 may generate a 2D model of the physical environment. For example, the floor plan model system 110 may generate top down 2D models 112 representing the wall segments based at least in part on the heatmaps 108 and/or the environment scan 104. For example, the system 110 may determine wall segments by detecting combinations of pairs between corners of the corner heatmap 108. The floor plan model system 110 may then utilize the pairs to form candidate wall segments. The floor plan model system 110 may then score each candidate wall segment by comparing the wall segment to the wall segment heatmap 108. The floor plan model system 110 may then select the segments having the highest response score with respect to the wall segment heatmap 108 as the wall segments for the 2D floor plan 112.

In some cases, the wall segments of the 2D model 112 may be unaligned and/or unclosed (e.g., a gap between the wall segments exists). In the current example, an orthogonalizing system 114 may be configured to receive the environmental scan 104, the heatmaps 108, and/or the 2D model 112 and to align or orthogonalize the wall segments of the 2D scan as well as close any gaps between the walls elements. In one example, the orthogonalizing system 114 may select or determine a trusted line segment from the existing line segments. For instance, the orthogonalizing system 114 may select a longest line segment as the trusted line segment. The orthogonalizing system 114 may then, for each other line segment (e.g., other than the trusted line segment), generate segment variants by rotating around the end points of the other line segments until a variant is determined to be parallel or orthogonal to the trusted line segment. In some cases, the variant may be parallel or orthogonal if the variant is less than or equal to a threshold angle of the trusted line segment. In some examples, two or more variants may be within the threshold angle and, in these examples, the orthogonalizing system 114 may score the two or more variants, for instance again, based at least in part on the wall segment heatmap.

In other cases, the orthogonalizing system 114 may receive the un-orthogonalized 2D floor plan 112 and then generate a distribution of angles between the wall segments and a selected direction. The orthogonalizing system 114 may then determine a direction vector for the model based at least in part on the distribution and perform an initial orthogonalization. For example, initially the orthogonalizing system 114 may adjust each wall segment to be either orthogonal to the direction vector (e.g., parallel or perpendicular to the direction vector). In some cases, the segment may be orthogonal, within the initial orthogonalization, if the segment is within a threshold angle of being parallel or perpendicular to the direction vector.

Following the initial orthogonalization, the orthogonalizing system 114 may then perform a strict orthogonalization on the segments to fully conform the segments with the direction vector. In some cases, the strict orthogonalization may comprise setting an "axis" of the model to align with the direction vector. The orthogonalizing system 114 may then select a point (such as an endpoint of a segment) and determine each point of the segment which is connected to the selected point (e.g., each point along the same line as the selected point and representing the segment). The orthogonalizing system 114 may then project the points on a line which passes through the selected point and at a position such that the segment is parallel to the "axis" (e.g., the direction vector). The orthogonalizing system 114 may then iterate through the remaining segments and either align parallel to the direction vector or to a vector perpendicular to the direction vector, for wall segments connecting parallel walls.

In some cases, the orthogonalizing system 114 may also identify unconnected endpoints (e.g., endpoints having only one associated segment). The orthogonalizing system 114 may then generate pairs between the unconnected endpoints. For each pair, the orthogonalizing system 114 may generate one or more variant line segment that may connect the two endpoints of the pair. The orthogonalizing system 114 may utilize different types of line segments, such as a straight, L-shaped, and the like. In some cases, the variant line segments may be generated by rotating the line segments about one or the other of the endpoints of the pair. The orthogonalizing system 114 may discard any line segment that intersects with an existing line segment. For the remaining line segments, the orthogonalizing system 114 may generate a score based at least in part on the wall segment heatmap and insert the highest scoring segments to complete the floor plan. In some cases, if the floor plan remains unclosed the orthogonalizing system 114 may generate additional variant line segments using all endpoint pairs even if the endpoint is already fully connected (e.g., connected to two line segments). The orthogonalizing system 114 may then retest by determining if the variant line segments intersect existing wall segments and scoring based at least in part on the wall segment heatmap 108.

In the current example, the connected and orthogonalized 2D model 112 is provided to a shell generation system 116. The shell generation system 116 may generate a shell 118 by projecting the walls of the 2D model 112 upward to a predefined distance, such as a ceiling height. In some cases, the ceiling height may be extracted from the environment scan 104 (such as via one or more machine learned models configured to output a room height or ceiling height). In the current example, the shell 118 may be provided to a shell refinement system 120. The shell refinement system 120 may smooth and fill any remaining holes or surfaces of the shell 118 to generate a refined shell 122. In some cases, the refinement system 120 may refine shell to 3D-scan while maintaining the shell's orthogonalization. In some cases, the shell refinement system 120 uses a non-linear optimization method to optimize several parameters and to minimize some residuals describing distance of corresponding points of the shell to 3D-scan or mesh. In some examples, optimizing parameters may represent and/or describe rotation and position in some coordinate system of the floorplan and of each segment separately. Some of segments may be fixed during the refinement process to maintain the orthogonalization of the shell. Residuals might differ from implementation to implementation and describe distance from the floorplan to 3D-scan. For example, distance from vertex of mesh to nearest floorplan segment might be considered as residual in some implementations.

In some examples, the system 100 may also include an object detection system 124. The object detection system 124 may be configured to detect objects 126 (such as furniture, appliances, staircases, opening, baseboards, fireplaces, and the like) and/or surfaces based at least in part on the environment scan 104, such as via one or more machine learned models or networks configured to segment and classify the objects. The object detection system 124 may also generate a point cloud associated with the object 126 and determine an object model for use as the object 126 in the refined shell 122 based at least in part on the point cloud data.

Once an object 126 is detected and the corresponding object model is selected, an object insertion system 128 may determine an alignment (e.g., a scale, rotation, and translation) of the object 126 with respect to the refined shell 122. The object insertion system 128 may then project based at least in part on the alignment, the object model into the refined shell 122, thereby placing the object 128 within the refined shell 122 to complete a 3D model 130 that may be output on a display 132 of the system 100 or another remote system.

FIGS. 2-14 are a flow diagrams illustrating example processes associated with generating three-dimensional models according to some implementations. The processes are illustrated as a collection of blocks in a logical flow diagram, which represent a sequence of operations, some or all of which can be implemented in hardware, software or a combination thereof. In the context of software, the blocks represent computer-executable instructions stored on one or more computer-readable media that, which when executed by one or more processors, perform the recited operations. Generally, computer-executable instructions include routines, programs, objects, components, encryption, deciphering, compressing, recording, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 2 illustrates an example flow diagram showing a process 200 for generating a three-dimensional model according to some implementations. As discussed above, the system (such as system 100 of FIG. 1) may receive a 3D environment scan representative of a physical environment, such as one or more rooms, and generate a 2D floor plan model of the physical environment. In some cases, the floor plan model may be projected to form a shell that is a 3D representation of the physical environment.

At 202, the system may receive the 3D scan of the physical environment. In the current example, a user may utilize a hand-held electronic device equipped with one or more image capture devices or sensors to scan the physical environment and generate the 3D scan. The 3D scan may include image data (such as frames of a video capture) representing walls, doors, windows, furniture, and the like. In some cases, the 3D scan may represent the interior of a room.

At 204, the system may generate, based at least in part on the 3D scan, a first 2D heatmap (such as a top down view) associated with predicted corners of the physical environment. For example, the system may input the 3D scan into one or more machine learned models or networks and receive as an output the first 2D heatmap.

At 206, the system may generate, based at least in part on the 3D scan, a second 2D heatmap (such as a top down view) associated with predicted wall segments of the physical environment. For example, the system may again input the 3D scan into one or more machine learned models or networks and receive as an output the second 2D heatmap.

At 208, the system may, based at least in part on the first heatmap (e.g., the corner heatmap), determine pairs of candidate corner positions. For example, the system may take each pair of corners represented in the first heatmap and group the corners as candidate pairs. The system may then generate a candidate wall segment between each set of candidate pairs.

At 210, the system may determine, for individual pairs, based at least in part on the second heatmap, a response value representative of a fit between the pairs and the second heatmap (e.g., the position of the walls in the physical environment). For example, the system may overlay the candidate wall segment over the second heatmap representing the predicted wall segment positions and determine the response value based on a percentage or amount of overlap.

At 212, the system may then group, based at least in part on the response value, the pairs into wall segments. For example, the system may select none intersecting wall segments having the highest ranking response values. In some examples, the system may organize the pairs into groups that form a substantially complete or closed environment and compare the grouped candidate pairs and candidate walls segment to the wall segment heatmap to generate a combined response value which may then be compared to other permutations or groups of grouped candidate pairs and candidate wall segments in order to select the highest ranking response value per group.

Figure 3:
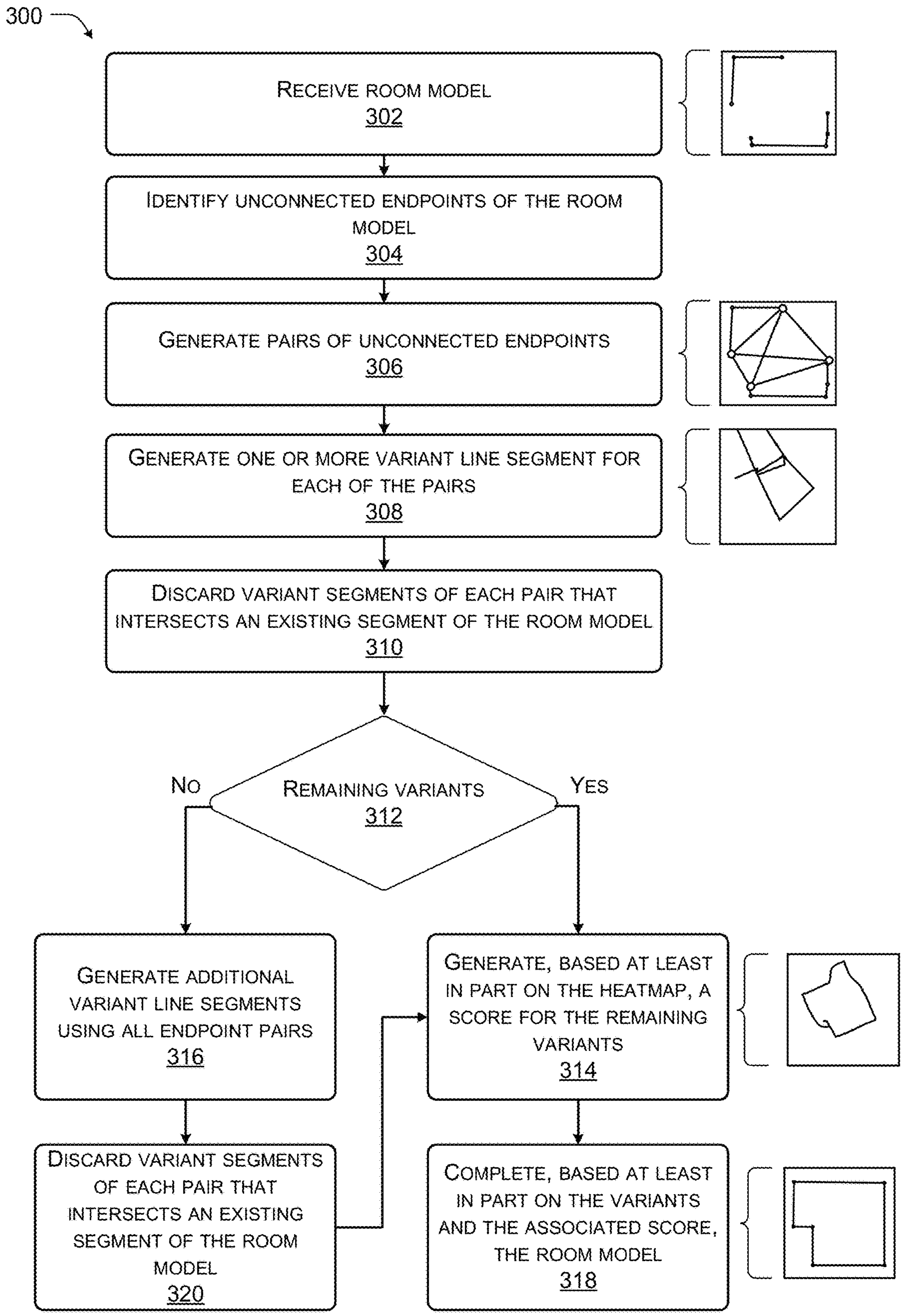
FIG. 3 illustrates an example flow diagram showing a process for closing a model of a physical environment based on a three-dimensional scan according to some implementations.

FIG. 3 illustrates an example flow diagram showing a process 300 for closing a model of a physical environment based on a three-dimensional scan according to some implementations. In some cases, the system may generate the wall segments for a 2D floor plan model as discussed above with respect to FIG. 2. However, in some instances, the wall segments may be unconnected or the model may be unclosed (e.g., gaps in the walls exist).

At 302, the system may receive a room model. For example, the room model may be a top down 2D floor plan view of a physical environment, such as a room. In some cases, the room model may be incomplete, such as when only partial wall segments can be determined using the heatmaps as discussed above.

At 304, the system may identify unconnected endpoints of the room model. For example, any endpoint coupled to only one wall segment may be considered an unconnected endpoint.

At 306, the system may generate pairs of unconnected endpoints and, at 308, the system may generate one or more variant line segments for each of the pairs. For example, the system may group each set of two endpoints as a pair. The system may then connect each pair of endpoints with one or more line segments. In some cases, the line segments may be straight, L-shaped, and the like. In some cases, the variant line segments may be generated by rotating the line segments about one or the other of the endpoints of the pair.

At 310, the system may discard variant line segments of each pair that intersects an existing line segment of the room model. For example, if the variant line segments intersect existing wall segments, then the physical representation of the current variant is highly unlikely and/or physically impossible and, therefore, may be discarded as a candidate for use in completion or closing of the room walls.

At 312, the system may determine any remaining variants (e.g., any variant line segments that do not intersect existing walls of the model). If there are remaining variant line segments, the process 300 may advance to 314. Otherwise, the process 300 may move to 316. At 314, the system may, based at least in part on a wall segment heatmap (such as the second heatmap of FIG. 2.), generate a response value score for the remaining variants. The system may then, at 318, complete, based at least in part on the variants and the associated score, the room model. For example, the system may select or insert the highest scoring variant as a wall segment of the room model.

At 316, the system may generate additional variant line segments using all endpoint pairs. For example, if the system has no remaining variants (e.g., each variant for each pair of unconnected endpoints intersects an existing wall), the system may generate line segments using the connected endpoints (e.g., endpoints connected to two or more wall segments). The system may then, at 320, discard any of the newly generated variants for the additional pairs of endpoints again if the variants intersect existing wall segments and the process 300 may advance to 314, as discussed above.

Figure 4:
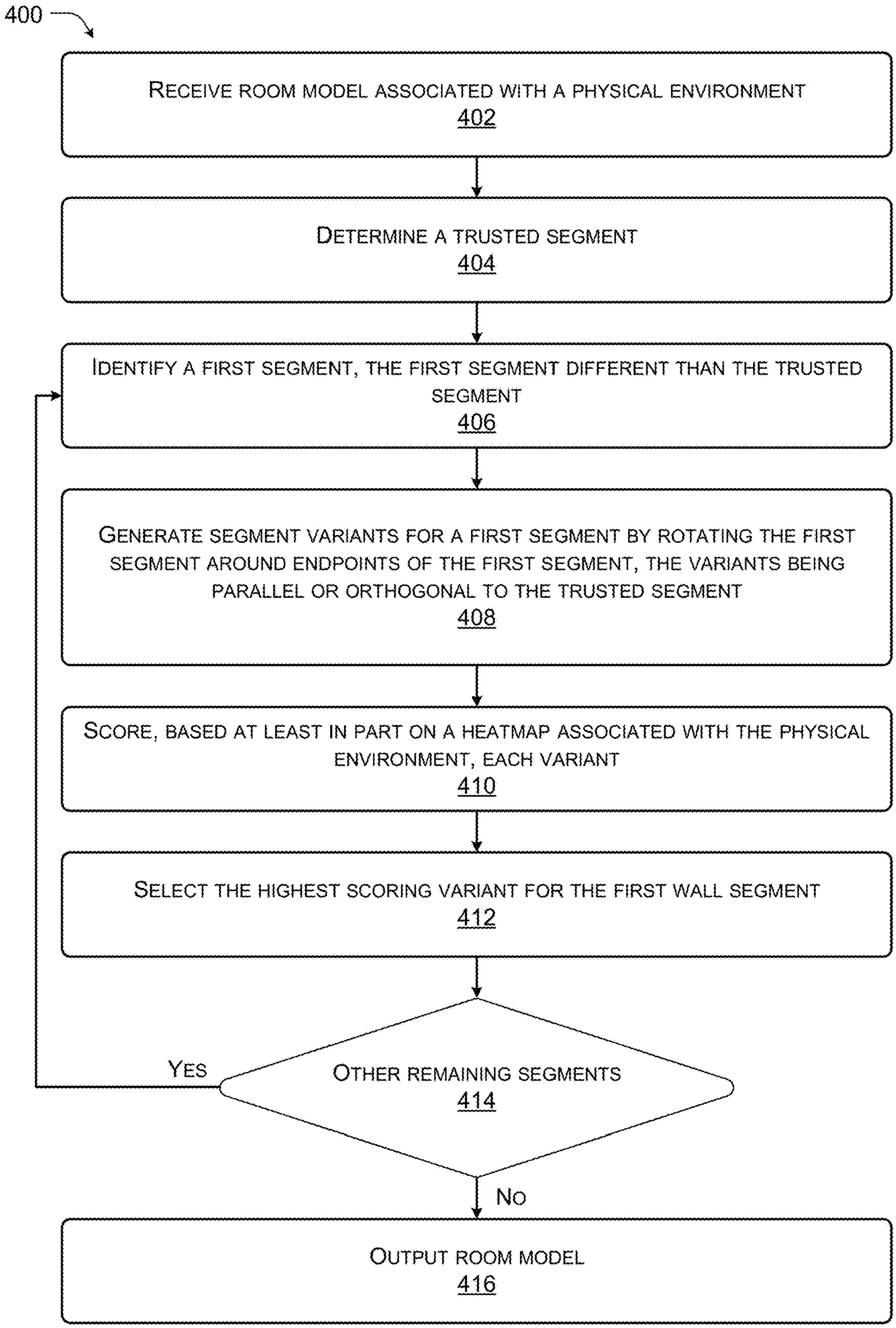
FIG. 4 illustrates an example flow diagram showing a process for orthogonalizing a model of a physical environment based on a three-dimensional scan according to some implementations.

FIG. 4 illustrates an example flow diagram showing a process 400 for orthogonalizing a model of a physical environment based on a three-dimensional scan according to some implementations. In some cases, the system may generate the wall segments for a 2D floor plan model as discussed above with respect to FIG. 2. However, in some instances, the wall segments may be unaligned (e.g., the walls are not orthogonal to each other).

At 402, the system may receive a room model associated with a physical environment. For example, the room model may be a top down 2D floor plan view of a physical environment, such as a room. In some cases, the room model may be incomplete, such as when only a partial wall segments can be determined using the heatmaps as discussed above.

At 404, the system may determine a trusted line segment from the existing line segments. For instance, the system may select a longest line segment as the trusted line segment.

At 406, the system may then identify a first segment, the first segment different than the trusted segment and, at 408, generate segment variants for the first segment by rotating the first segment around endpoints of the first segment, the variants being parallel or orthogonal to the trusted segment. In some case, the variant may be parallel or orthogonal if the variant is less than or equal to a threshold angle of the trusted line segment. In this example, the first segment is selected prior to processing the segments and, as such, the first segment is trusted and unprocessed.

At 410, the system may score, based at least in part on a heatmap (such as the wall segment heatmap of FIG. 2) associated with the physical environment, each variant for the first segment and, at 412, the system may select the highest scoring variant for the first wall segment in the 2D floor model. For instance, if the system determines two or more variants may be within the threshold angle (of parallel or orthogonal to the trusted segment), the system may select between the two segments based at least in part on each's score.

At 414, the system may determine if there are other remaining segments to orthogonalize with the trusted segment. If there are other remaining segments, the process 400 may return to 406 and the system selects another segment. Otherwise, the process 400 advances to 416 and the system, at 416, outputs the room model (e.g., the 2D floor model of the physical environment).

Figure 5:
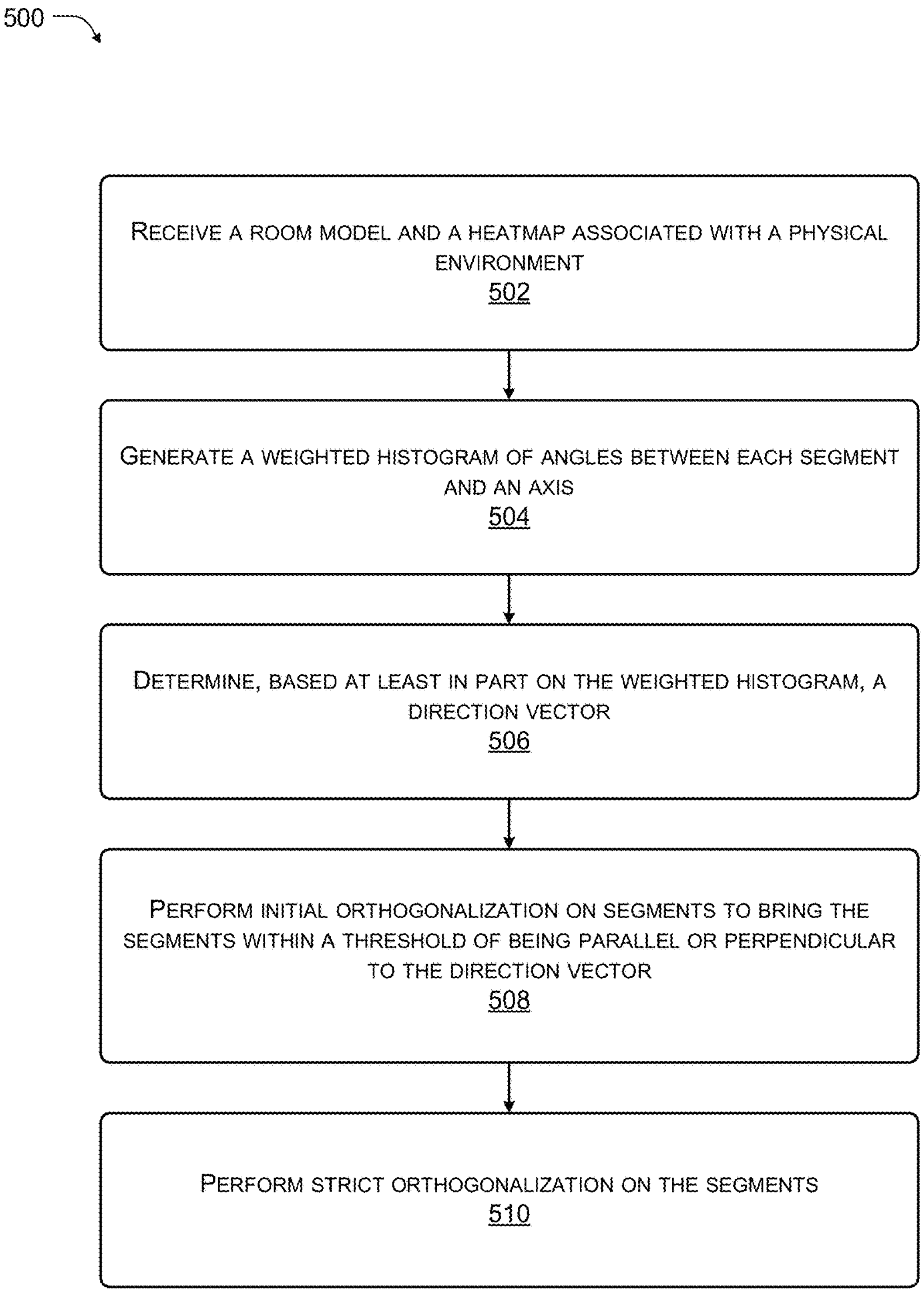
FIG. 5 illustrates an example flow diagram showing a process for orthogonalizing a model of a physical environment based on a three-dimensional scan according to some implementations.

FIG. 5 illustrates an example flow diagram showing a process 500 for orthogonalizing a model of a physical environment based on a three-dimensional scan according to some implementations. In some cases, the system may generate the wall segments for a 2D floor plan model as discussed above with respect to FIG. 2. However, in some instances, the wall segments may be unaligned (e.g., the walls are not orthogonal to each other).

At 502, the system may receive a room model and a heatmap (such as the wall segment heatmap of FIG. 2) associated with a physical environment. For example, the room model may be a top down 2D floor plan view of a physical environment, such as a room. In some cases, the room model may be incomplete, such as when only partial wall segments can be determined using the heatmaps as discussed above.

At 504, the system may generate a weighted distribution of angles between each segment and an axis (such as an X axis, Y axis, or other horizontal axis of the heatmap). For example, the system may determine the angle or difference in angle between the selected segment and the axis (such as in range [0°-90°]) and generate a distribution representing the relationships. In some cases, the system may weight the angles based on a length of the corresponding segment. The system may also smooth the distribution.

At 506, the system may determine, based at least in part on the weighted distribution, a direction vector for use in the 2D room model. For example, the system may select the highest scoring angle as the angle for use in the direction vector. In this case, the direction vector may be set as an axis of the room model to which align each of the segments during orthogonalization.

At 508, the system may perform initial orthogonalization on segments to being the segments within a threshold of being parallel or perpendicular to the direction vector. For example, the system may optimize wall segments and the direction vector maximizing similarity based at least in part on the heatmap. For instance, as an optimization parameters the system might utilize coordinates of the endpoints and coordinates of the direction vector. The system may then determine an error for each segment. The error may be determined by selecting a predetermined number of points (such as 5, 10, 12, 20, 26, 30, or the like) along the segment (on a uniform one-dimensional grid). The system may then determine a segment intensity each point. The error may then be computed based at least in part on a weight of the cost. In this manner, the system may maximize segment intensity with respect to the heatmap.

In some examples, the system may determine the orthogonalization cost for each segment having two endpoints, which should be orthogonalized. The cost may be determined by first determining the closest normalized vector corresponding with the direction vector. The system then determines a desired position of one of the endpoints. The system may run the optimization process several times, such that after each run, the system doubles the weight of orthogonalization cost and determines shell segments to be orthogonalized again. In some cases, the system may continue to iterate a greatest angle between an orthogonalized segment and direction vector is less than or equal to a threshold. For example, the system may iterate until the greatest angle is less than 0.1°.

At 510, the system may perform strict orthogonalization on the segments of the model. For example, during strict orthogonalization, the system may make orthogonalized segments coincide (within a second threshold) with or match the direction vector. Since initial orthogonalization, at 508, brought the segments close enough, the strict orthogonalization may minimally adjust the shell position. In some cases, the system may perform strict orthogonalization by first setting an axis of the model to the direction vector. The system may then take a point (such as an endpoint of a segment) that was not changed during a prior iteration or the step 510 and determines points which are connected to the selected point with an orthogonalized segment which should be parallel to the axis (e.g., the angle between these segments and axis is substantially approximate to 0° or 180°). The system may then project the points on a line which passes through the selected point and parallel to the axis. The system may then iterate the process above for each point of the shell and then repeat the process of 510 with the system considering the axis as perpendicular to the main direction.

In this example, after initial orthogonalization wall segments are close to be parallel/orthogonal to each other and/or the direction vector (angles may vary up to) 0.1°) and strictly parallel/orthogonal after strict orthogonalization. In other cases, after initial orthogonalization the wall segments may be within a first threshold (such as the) 0.1°) and after strict orthogonalization within a second threshold (such as 0.05°, 0.01°, 0.005°, or the like)

FIG. 6 illustrates an example flow diagram showing a process 600 for refining a model (or shell) of a physical environment based on a three-dimensional scan according to some implementations. In this example, the system may generate a 3D model of the physical environment by preserving the shell or mesh generated from the scan.

At 602, the system may receive the 3D scan and shell of the physical environment. In this example, the system may receive an initial shell of the 3D physical environment as well as 3D scan including image data representative of the physical environment. The shell may be rough (e.g., including unsmoothed walls or surfaces or the like). In some cases, the shell may be the output of process 500 discussed above which may indicate a main direction or direction vector.

At 604, the system may parameterize segments of a shell generate from the 3D scan. For example, the system may determine a rotation matrix for the shell based on a main direction or direction vector. The system may then determine an angle, between the segment direction and the axis and a distance from the origin to the segment. It should be understood that during parameterization the system does not utilize any information about endpoints of the segments. In some cases, however, the endpoints may be computed as intersection between two segments.

At 606, the system may perform, based at least in part on the parameters, refinement on the shell and/or on the wall segments. For example, the system may orthogonalize the segments based at least in part on a residuals of the rotation matrix, the distance, and/or the angle discussed above with respect to 604 and a cost for each segment (such as based on the mesh generated from the 3D scan). For orthogonalized segments, the system may fix the angle between the segment direction and the axis to preserve direction relative to the direction vector (e.g., the main direction) and determine a cost which evaluates the error. In some cases, the error may represent a closeness between the 3D scan and the shell and, for example, may be determined by distance between vertex of the 3D mesh of the 3D scan and a nearest segment multiplied by some weighted coefficient. For example, the weighted coefficient may be derived from area of adjacent faces to the vertex and angle between normal in that vertex and horizontal plane.

Figure 7:
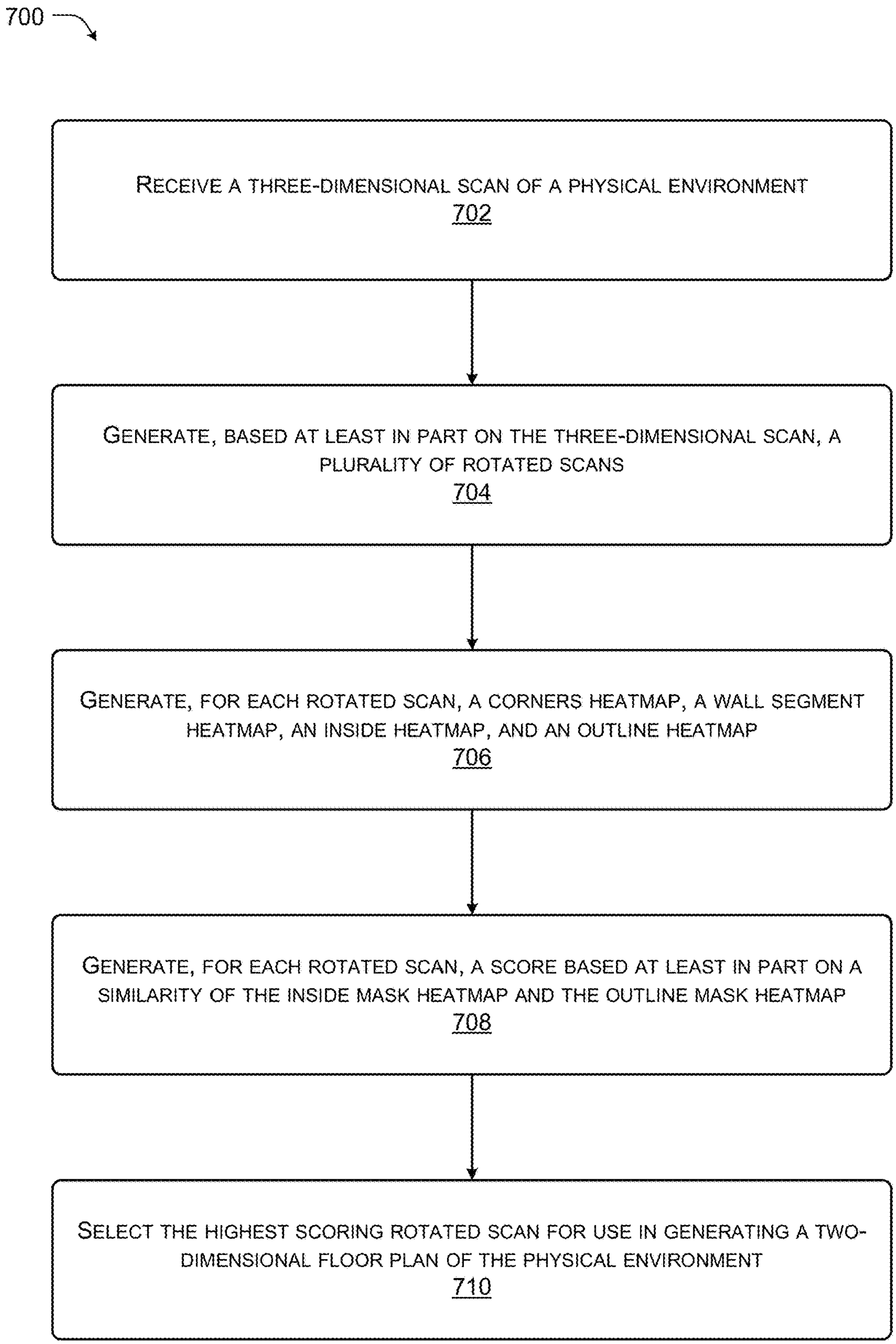
FIG. 7 illustrates an example flow diagram showing a process for generating a two-dimensional floor plan according to some implementations.

FIG. 7 illustrates an example flow diagram showing a process 700 for generating a two-dimensional floor plan according to some implementations. As discussed above, the system (such as system 100 of FIG. 1) may receive a 3D environment scan representative of a physical environment, such as one or more rooms, and generate a 2D floor plan model of the physical environment. In some cases, the floor plan model may be projected to form a shell that is a 3D representation of the physical environment.

At 702, the system may receive the 3D scan of the physical environment. In the current example, a user may utilize a hand-held electronic device equipped with one or more image capture devices or sensors to scan the physical environment and generate the 3D scan. The 3D scan may include image data (such as frames of a video capture) representing walls, doors, windows, furniture, and the like. In some cases, the 3D scan may represent the interior of a room.

At 704, the system may generate, based at least in part on the 3D scan, a plurality of rotated scans. For example, the system may rotate the 3D scan about a fixed position, such as a center point or the like.

At 706, the system may generate, for each rotated scan, a corner heatmap, a wall segment heatmap, an inside heatmap, and an outline heatmap. In some cases, the system may include one or more machine learned model and/or network that is configured to receive the rotated scans as an input and output the heatmaps in response.

At 708, the system may generate, for each rotated scan, a score based at least in part on a similarity of the inside heatmap and the outline heatmap associated therewith. In other examples, the system may generate the scores based at least in part on a union of the inside heatmap and the outline heatmap.

At 710, the system may select the highest scoring rotated scan for use in generating a 2D floor plan of the physical environment. For example, once the rotated scan is selected, the rotated scan may be used to generate a 2D model of the physical environment as discussed herein.

Figure 8:
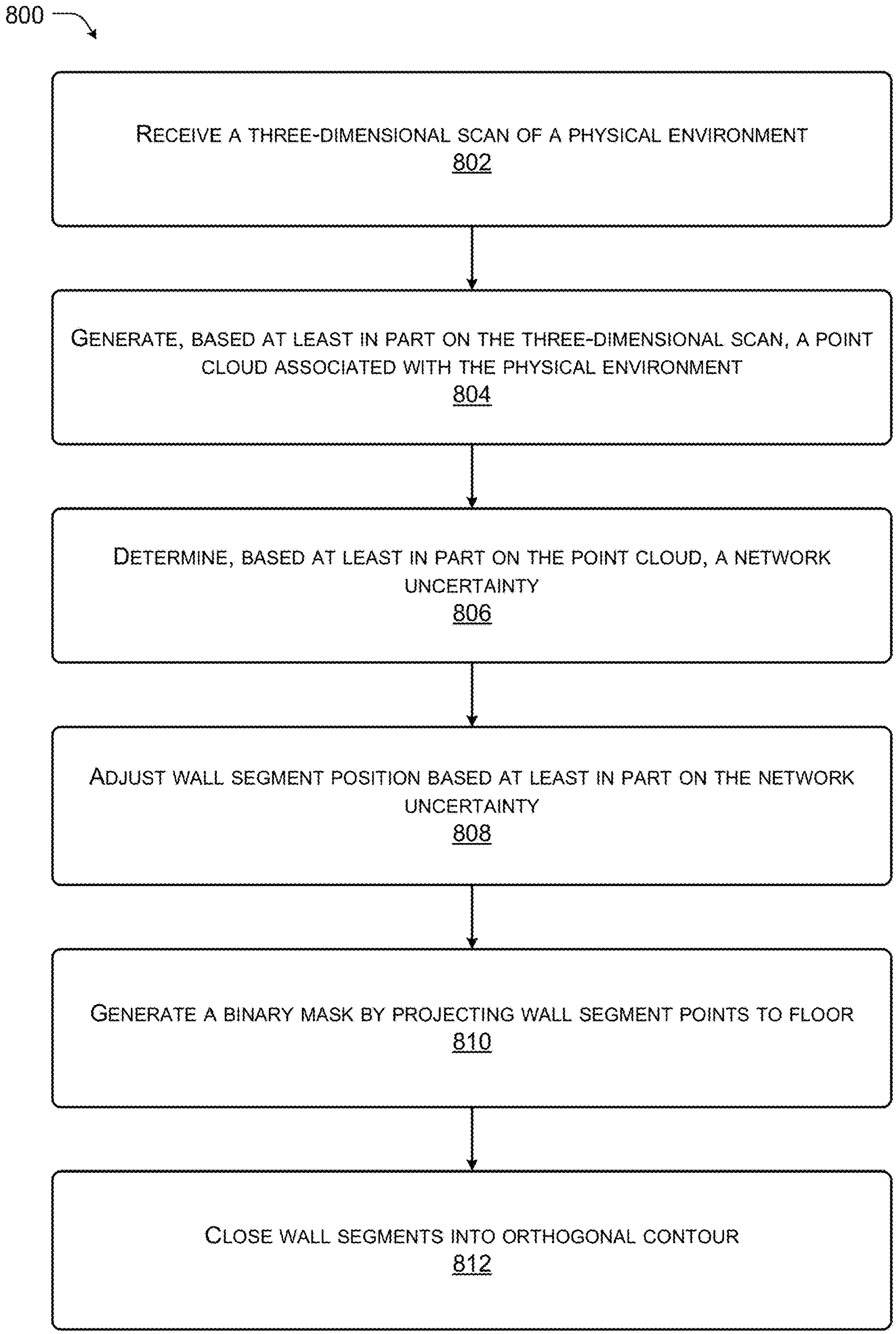
FIG. 8 illustrates an example flow diagram showing a process for generating a two-dimensional binary mask of wall segments of a model of a physical environment based on a three-dimensional scan according to some implementations.

FIG. 8 illustrates an example flow diagram showing a process 800 for generating a two-dimensional binary mask or heatmap of wall segments of a model of a physical environment based on a three-dimensional scan according to some implementations. As discussed above, the system (such as system 100 of FIG. 1) may receive a 3D environment scan representative of a physical environment, such as one or more rooms, and generate a 2D floor plan model of the physical environment. In some cases, the floor plan model may be projected to form a shell that is a 3D representation of the physical environment.

At 802, the system may receive the 3D scan of the physical environment. In the current example, a user may utilize a hand-held electronic device equipped with one or more image capture devices or sensors to scan the physical environment and generate the 3D scan. The 3D scan may include image data (such as frames of a video capture) representing walls, doors, windows, furniture, and the like. In some cases, the 3D scan may represent the interior of a room.

At 804, the system may generate, based at least in part on the 3D scan, a point cloud associated with the physical environment. For example, in some instances, the point cloud may represent the surfaces of the walls. In some cases, the system may predict a shift for each point of the 3D scan into point cloud towards closest wall. Then, filter points with large uncertainty. Next, the system may project remaining points to the floor to generate a 2D binary floor plan of the walls. From the 2D floor plan wall segments may be extracted, orthogonalized and closed, as discussed herein.

At 806, the system may determine, based at least in part on the point cloud, a network uncertainty. For example, the system may determine a network uncertainty for each point inside the physical environment. In some case, the uncertainty is constructed in an outline fashion and proportional to a current error (such as determined based on a distance between a scan point and a nearest wall) in the distance prediction.

At 808, the system may adjust wall segment position based at least in part on the network uncertainty and, at 810, the system may generate a binary mask by projecting wall segment points to the floor. For example, the binary mask may be a 2D outline from a top down view of the walls of the physical environment. For example, lines may be determined based at least in part on a line transform. Each line is then converted to a segment and a segment heatmap may be extracted as intersection of the segment with the binary mask. In some cases, separate segments in a segments heatmap are determined by clusterization. Each segment may be filtered by size, such that only segments greater than or equal to a size threshold remain. The segments are sorted in length decreasing order and non-maximum suppression is performed to filter smaller segments in neighborhood of the longer segments.

At 812, the system may close wall segments into orthogonal contours, as discussed below with respect to FIG. 9.

Figure 9:
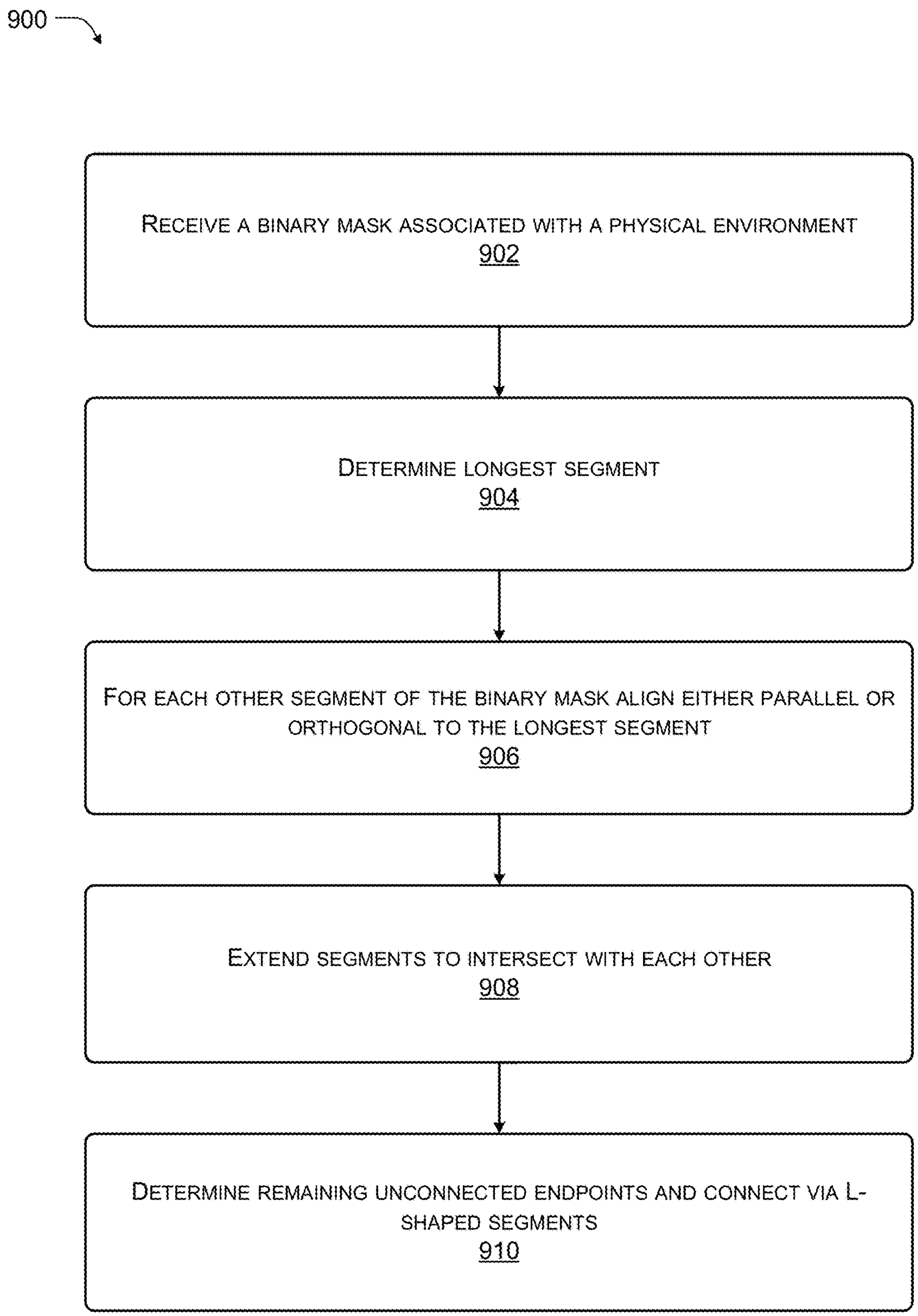
FIG. 9 illustrates an example flow diagram showing a process orthogonalizing and closing a model of a physical environment based on walls binary mask according to some implementations.

FIG. 9 illustrates an example flow diagram showing a process 900 orthogonalizing and closing a model of a physical environment based on walls binary mask according to some implementations. As discussed above, the system may receive a 2D floor plan model of the physical environment. In some cases, the 2D floor plan may have unclosed segments and/or unaligned or un-orthogonalized wall segments.

At 902, the system may receive a binary mask associated with a physical environment. For example, the binary mask may be a 2D outline from a top down view of the walls of the physical environment. For example, lines may be determined based at least in part on a Hough lines transform. Each line is then converted to a segment and a segment heatmap may be extracted as intersection of the segment with the binary mask. In some cases, separate segments in a segments heatmap are determined by clusterization. Each segment may be filtered by size, such that only segments greater than or equal to a size threshold remain. The segments are sorted in length decreasing order and non-maximum suppression is performed to filter smaller segments in neighborhood of the longer segments.

At 904, the system may determine the longest segment in the binary mask. For example, the system may utilize the longest segment as a trusted segment (as discussed above) and assign a direction vector or main direction based at least in part on the alignment or angle of the longest segment with respect to an axis.

At 906, for each other segment of the binary mask, the system may align either parallel or orthogonal to the longest segment (or trusted segment). For example, for each segment (other than the longest segment), the system may generate segment variants by rotating the first segment around endpoints of the current segment to identify variants being parallel or orthogonal to the longest segment. In some case, the variant may be parallel or orthogonal if the variant is less than or equal to a threshold angle of the longest line segment. The system may score, based at least in part on a heatmap (such as the wall segment heatmap of FIG. 2) associated with the physical environment, each variant for the current segment and select the highest scoring variant for use as the current segment in the 2D floor model.

At 908, the system may extend segments to intersect with each other. For example, in some cases, gaps may exist between the wall segments. The system may attempt to close the gaps by extending the segments until the segments intersect with each other, thereby forming corners of the 2D floor model.

At 910, the system may determine if any endpoints remain unconnected (e.g., not connected to two or more segments) and connect the unconnected endpoints via L-shaped segments. For example, the system may determine a distance between pairs of the remaining endpoints. The system may then rank the endpoints in order of increasing distance between each other and attempt to connect them with additional L-shaped segments orthogonal to either of the of the pairs of endpoints. The best closing is chosen based at least in part on the highest intersection of newly added segments (e.g., the inserted L-shaped segments) with the binary mask. In some cases, if the new L-shaped segments intersect any existing wall segments, the L-shaped segment is discarded.

Figure 10:
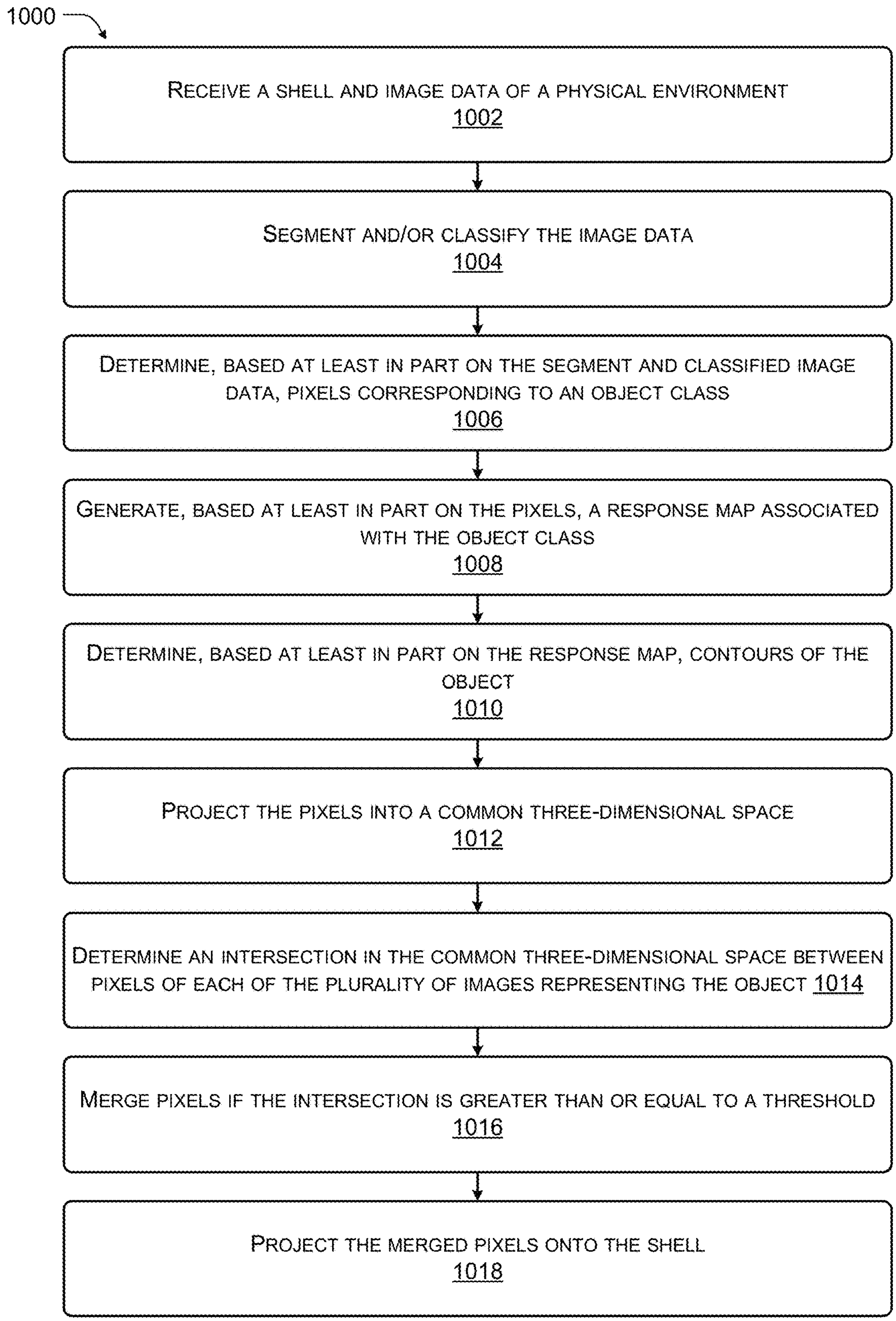
FIG. 10 illustrates an example flow diagram showing a process for inserting windows and doors into a three-dimensional model according to some implementations.

FIG. 10 illustrates an example flow diagram showing a process for inserting windows and doors into a three-dimensional model according to some implementations. In some cases, the system may generate a 2D floor model and/or 3D model (such as a CAD model) of a physical environment. In the examples discussed herein, the system may generate a 3D shell of a physical environment based at least in part on configuring and orthogonalizing wall segments. However, in some cases, the system may insert doors and windows into the 3D shell to assist with generation of a 3D model more representative of the physical room.

At 1002, the system may receive a shell (e.g., a 3D model) and image data (e.g., a 3D scan) of a physical environment. The image data may include a plurality of images or frames of the physical environment. For example, a user may utilize a hand-held electronic device equipped with one or more image capture devices or sensors to scan the physical environment and generate the 3D scan. The 3D scan may include image data (such as frames of a video capture) representing walls, doors, windows, furniture, and the like. In some cases, the 3D scan may represent the interior of a room.

At 1004, the system may segment and/or classify the image data and, at 1006, the system may determine, based at least in part on the segmented and classified image data, pixels corresponding to an object class. For example, the system may utilize one or more machine learned models or networks to identify, such as per pixel, objects within the image data and to classify the objects. For example, the system may determine and classify pixels associated with doors and/or windows of the physical environment.

At 1008, the system may generate, based at least in part on the pixels of a class, a response map associated with the object class. For example, the system may place pixels classified with a particular class (such as all pixels representing doors) onto a response map representing the particular class pixels (e.g., the door pixels). In some cases, the system may label each instance of an object within the class with a different identifier. In these cases, the system may include the identifier for each pixel as part of the response map. In this manner, the system may determine if adjacent and/or overlapping pixels belong to the same instance of the object.

At 1010, the system may determine, based at least in part on the response map, contours of the object. In some cases, the contours of the object may be determined on a pixel by pixel basis for the object having a shared identifier within the response map. In some cases, the system may determine based on the response map an external portion of the object and all pixels inside the contour are considered candidates for the detected object.

At 1012, the system may project the pixels into a common 3D space and, at 1014, the system may determine an intersection in the common 3D space between pixels of each of the plurality of images representing the object. For example, the system may determine intersection of the pixels based at least in part on the identifiers assigned during classification and segmentation.

At 1016, the system may merge pixels if the intersection is greater than or equal to a threshold amount of overlapping pixels in the common 3D space. For example, if the pixels from different images or frames overlap in the common 3D space the pixels may be merged into a single object.

At 1018, the system may project the merged pixels into the shell. For example, the merged pixels may provide a more accurate representation and placement of the object within the shell as different frames or images may provide different views of the object that may assist with placement and alignment with respect to the shell as discussed herein.

Figure 11:
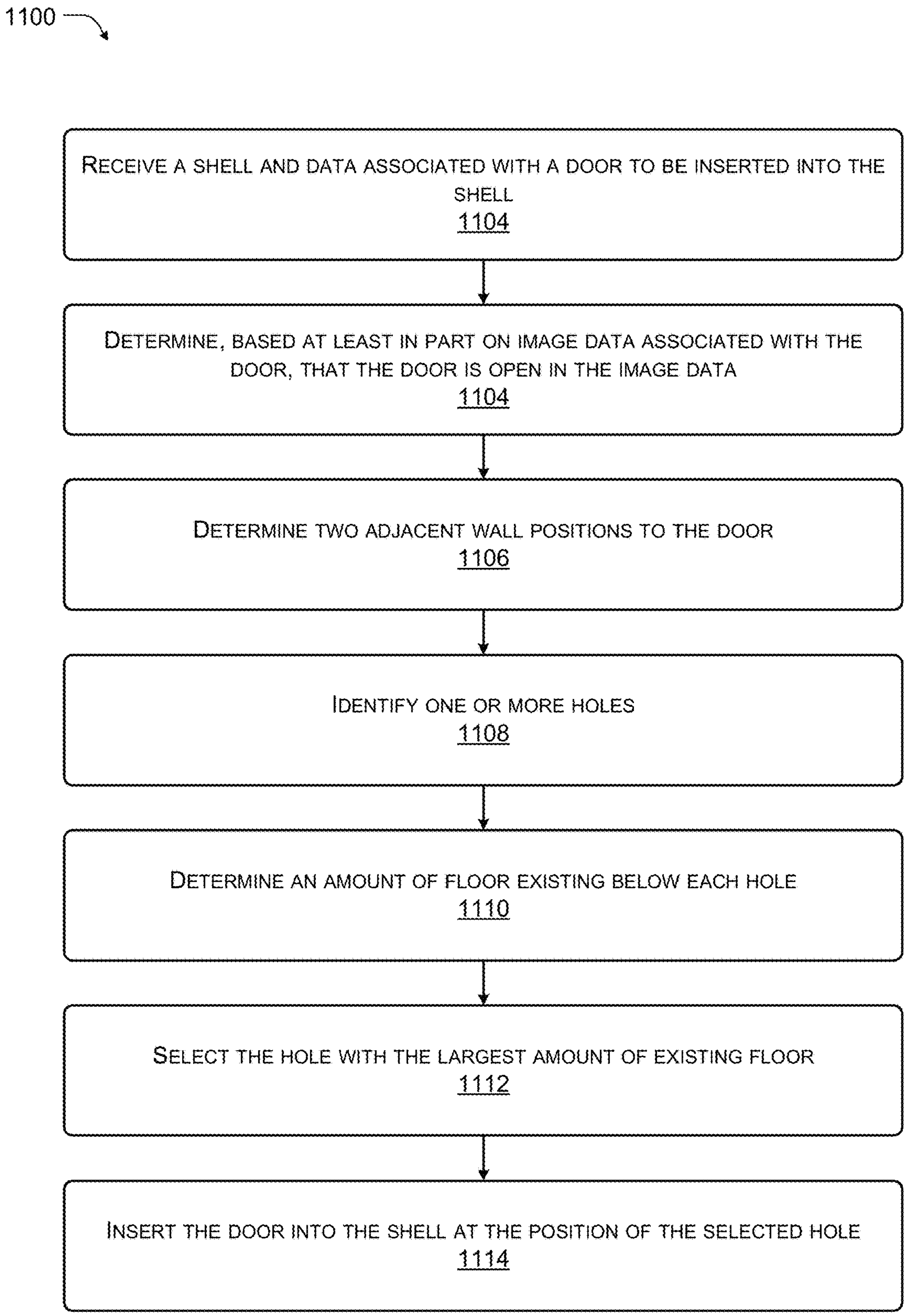
FIG. 11 illustrates an example flow diagram showing a process for determining open door locations in a shell according to some implementations.

FIG. 11 illustrates an example flow diagram showing a process 1100 for determining open door locations in a shell according to some implementations. As discussed above with respect to FIG. 10, the system may be configured to insert objects such as doors and windows into the 3D shell. In some cases, during a capture, the 3D scan may capture data associated with the door in an open configuration. In these cases, the door, in a closed configuration, may be placed to either adjacent position (e.g., to the right or left of the open door). As discussed below, process 1100 provides one example process for determining the correct position of the door along the shell or wall.

At 1102, the system may receive a shell and data associated with a door to be inserted into the shell. For example, the system may determine to perform process 1100 following detection of the door as part of the process 1000. In these cases, the system may determine the door object within the physical environment but include two potential positions of the door.

At 1104, the system may determine, based at least in part on image data (e.g., frames of the 3D scan) associated with the door, that the door is open in the image data. For instance, if the door is closed then the door position is already known, the system may insert the door in a manner similar to a window as discussed above. However, if the door is open, the process 1100 may continue to 1106 and the system may determine the correct position.

At 1106, the system may determine two adjacent wall positions to the door. For example, the system may determine positions to the right and left of the door. In some cases, if the door is located at a corner the two adjacent wall positions may be on differing wall segments.

At 1108, the system may identify one or more holes at the two adjacent wall positions. For example, the door opening may result in a hole in the 3D scan and, thereby, the shell at which the door should be placed. However, in some cases, the open door may also obstruct the scan resulting in a second hole in the 3D scan (or image data) behind the door. Thus, if the system detects a single hole the system may advance to 1114 and insert the door into the hole. However, if two or more holes exist then the process 1100 may advance to 1110.

At 1110, the system may determine an amount of floor existing below the hole. For example, if the hole is representative of an open door, then the floor should be visible in the 3D scan (e.g., the image data). however, if the hole is obstructed by the door, then the floor is also often obstructed by the door resulting in a continuation or additional hole in in the image data representing the floor. In some cases, the amount may be a percentage of floor existing in a predefined space or area below the wall segment corresponding to the hole.

At 1112, the system may select the hole with the largest amount (or highest percentage) of existing floor and, at 1114, the system may insert the door into the shell at the position (e.g., to the right or left) of the selected hole.

Figure 12:
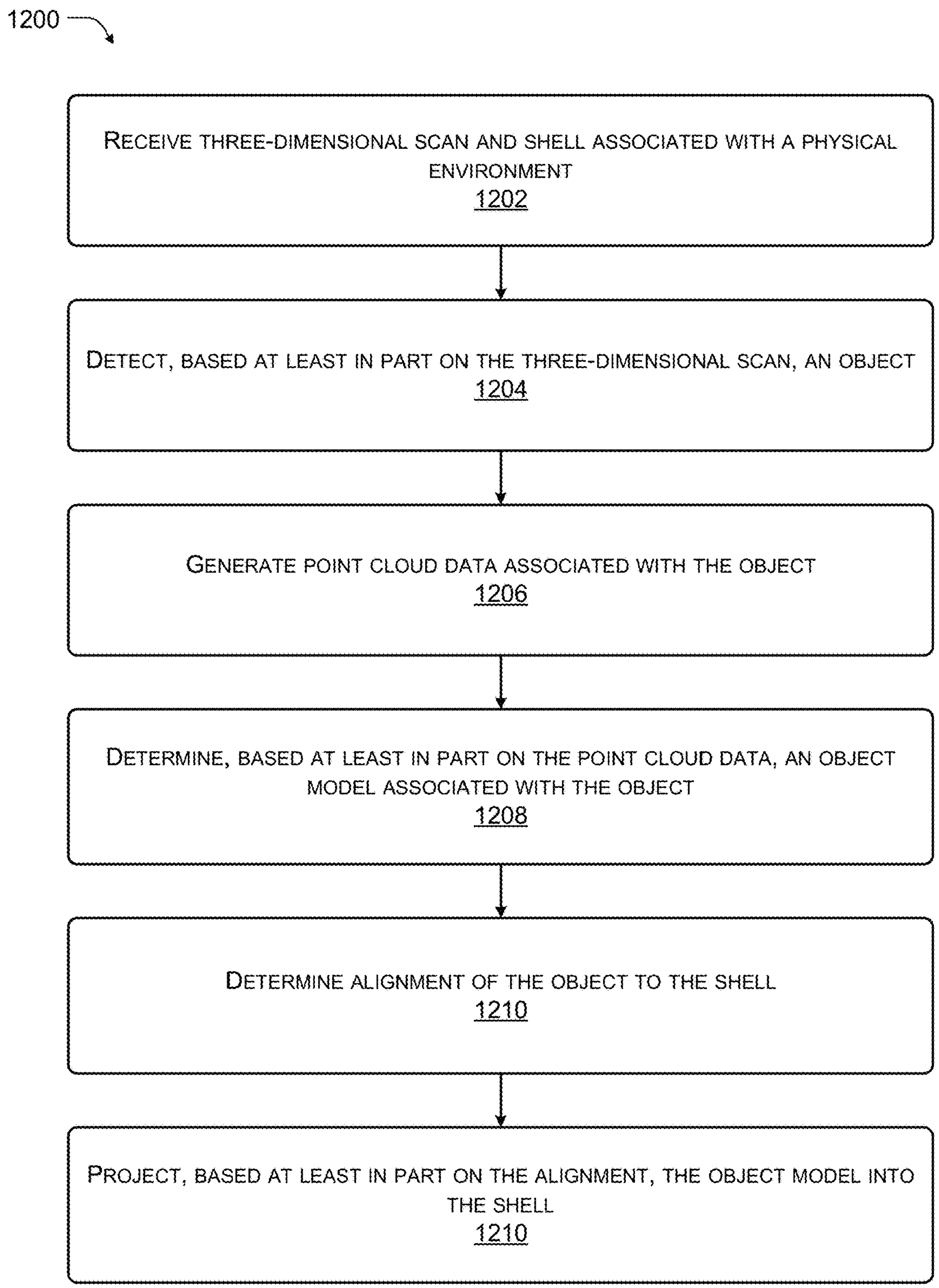
FIG. 12 illustrates an example flow diagram showing a process for inserting objects into a three-dimensional model according to some implementations.

FIG. 12 illustrates an example flow diagram showing a process 1200 for inserting objects into a three-dimensional model according to some implementations. In some cases, the system may also insert object within the physical environment into the 3D model. For example, the system may insert furniture and the like into the model to improve the experience of viewing the 3D model as a model of the physical environment.

At 1202, the system may receive a 3D scan and a shell associated with a physical environment. For example, 3D scan may be an image data captured by a user of a physical environment, as discussed above, and the shell may be a 3D model of the physical environment generated using the system and processes discussed herein.

At 1204, the system may detect, based at least in part on the 3D scan, an object and, at 1206, system may generate point cloud data associated with the object. For example, the system may detect a unit of furniture within the scan of the 3D environment as part of the segregation and classification of the 3D scan. As an illustrative example, a neural network (or other machine learned model) may be trained to perform semantic segmentation and object centered regression. For each point (or pixel) in the 3D scan, the neural network predicts a class label and vector of shifts (dx, dy, dx) to the center of mass of the object to which the point belongs. The system may then cluster and predict a center of mass with, for instance, a DBSCAN. The system may then select the class of the object instance based at least in part on the labels of each point in the cluster (e.g., the largest number of similar labels defines the class).

At 1208, the system may determine, based at least in part on the point cloud data, an object model associated with the object. For example, the system may input the point cloud data into one or more additional machine learned models or networks and as an output of the machine learned models receive an object model (such as a CAD object model).

At 1210, the system may determine an alignment of the object to the shell. For example, the system may determine a rotation, scale, and/or translation with respect to the object and the shell. For example, the system may input the point cloud data of the object as well as point cloud data of the shell into one or more additional machine learned models or networks and as an output of the machine learned models receive the rotation, scale, and/or translation.

At 1212, the system may project, based at least in part on the alignment, the object model into the shell. For example, the projection may be based on the rotation, scale, and translation of the object determined in 1210.

Figure 13:
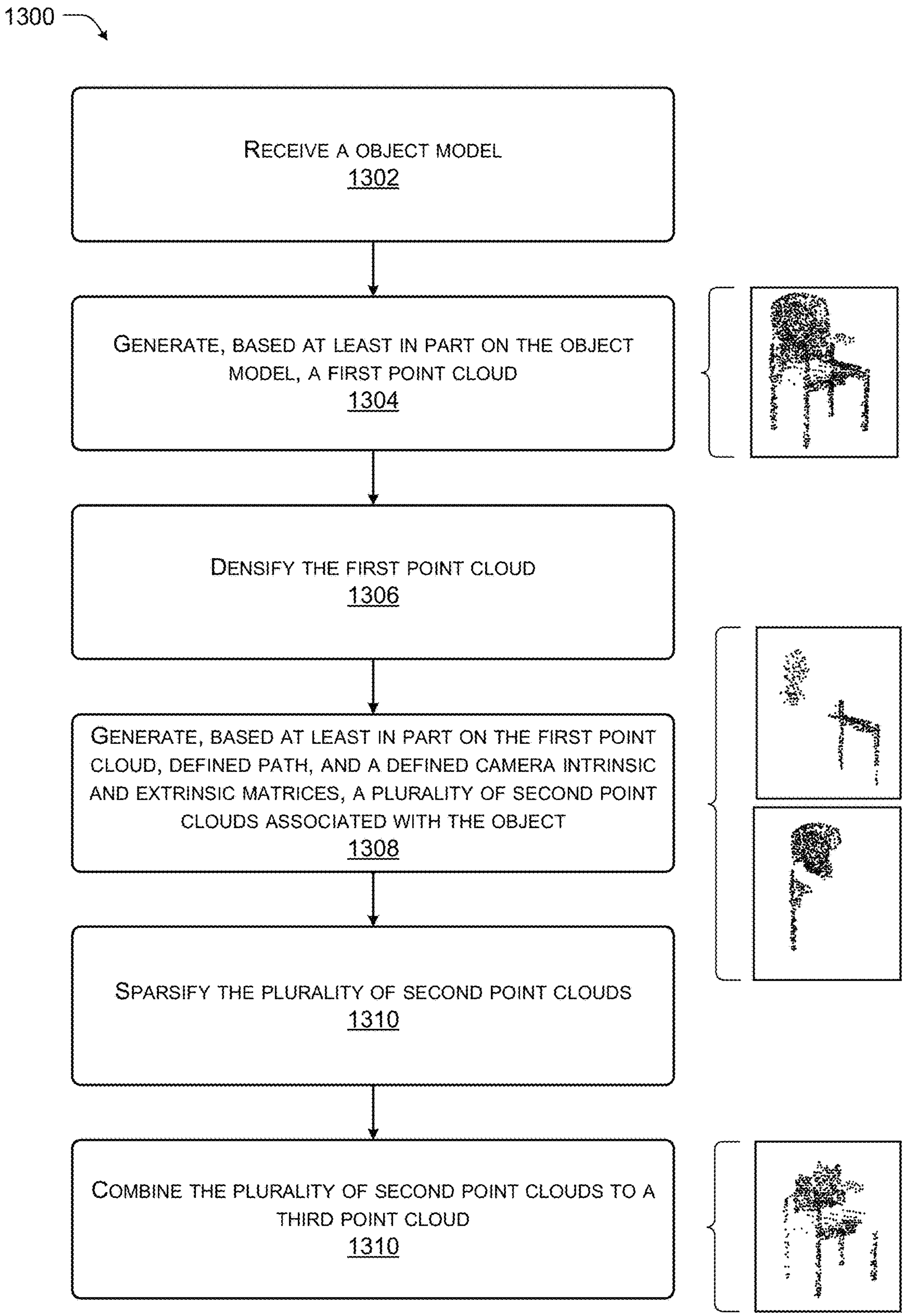
FIG. 13 illustrates an example flow diagram showing a process for training a machine learned model or network to detect object models based on point cloud data according to some implementations.

FIG. 13 illustrates an example flow diagram showing a process for training a machine learned model or network to detect object models based on point cloud data according to some implementations. As discussed above with respect to process 1200, the system may detect and insert objects, such as furniture, within a 3D model or shell using one or more machine learned models and/or networks. In process 1300 the system may generate point cloud data from 3D models, such as CAD models to use in training the one or more machine learned models and/or networks.

At 1302, the system may receive an object model. For example, the system may receive a 3D model of a unit of furniture, such as chair. In some case, the object model may be received from a manufacturer or other third party associated with the unit of furniture.

At 1304, the system may generate, based at least in part on the object model, a first point cloud and, at 1306, the system may densify the first point cloud. For example, the system may generate a point cloud by taking pixels from the object model and rending them as points in 3D space. In some cases, the system may generate a denser point cloud from the first point cloud data.

At 1308, the system may generate, based at least in part on the first point cloud, a defined path, and defined camera intrinsic and extrinsic matrices, a plurality of second point clouds associated with the object. For example, the system may select a path, circle or arc about the first point cloud. The system may then generate still images or partial images of the point cloud based on the position on the path and the defined camera intrinsic and extrinsic matrices. The resulting second point clouds may each partially represent the object as some of the objects point cloud data is obstructed from the capture position. In some cases, the system may generate the second point cloud by dividing the first point cloud into pieces using clusterization and selecting the largest cluster and a random selection of smaller clusters to use in generation of the second point clouds. In some cases, the random selection may include a predetermined number of small clusters. For the selected clusters, including the largest cluster, the system may shift random points in the direction of the points normals (or in reverse to the normals) to simulate physical scanner or camera inaccuracies.

At 1310, the system may then sparsify the plurality of second point clouds. For example, to more accurately represent the point cloud data of the object generated from a 3D scan the system may sparsify or reduce the amount of data associated with each of the second point clouds.

At 1312, the system may then recombine or combine the plurality of second point clouds into a third point cloud that may be utilized to train the machine learned models. In this manner, the resulting third point cloud may represent a point cloud similar to those generated from the 3D scan having image data of the object from multiple directions and camera positions.

Figure 14:
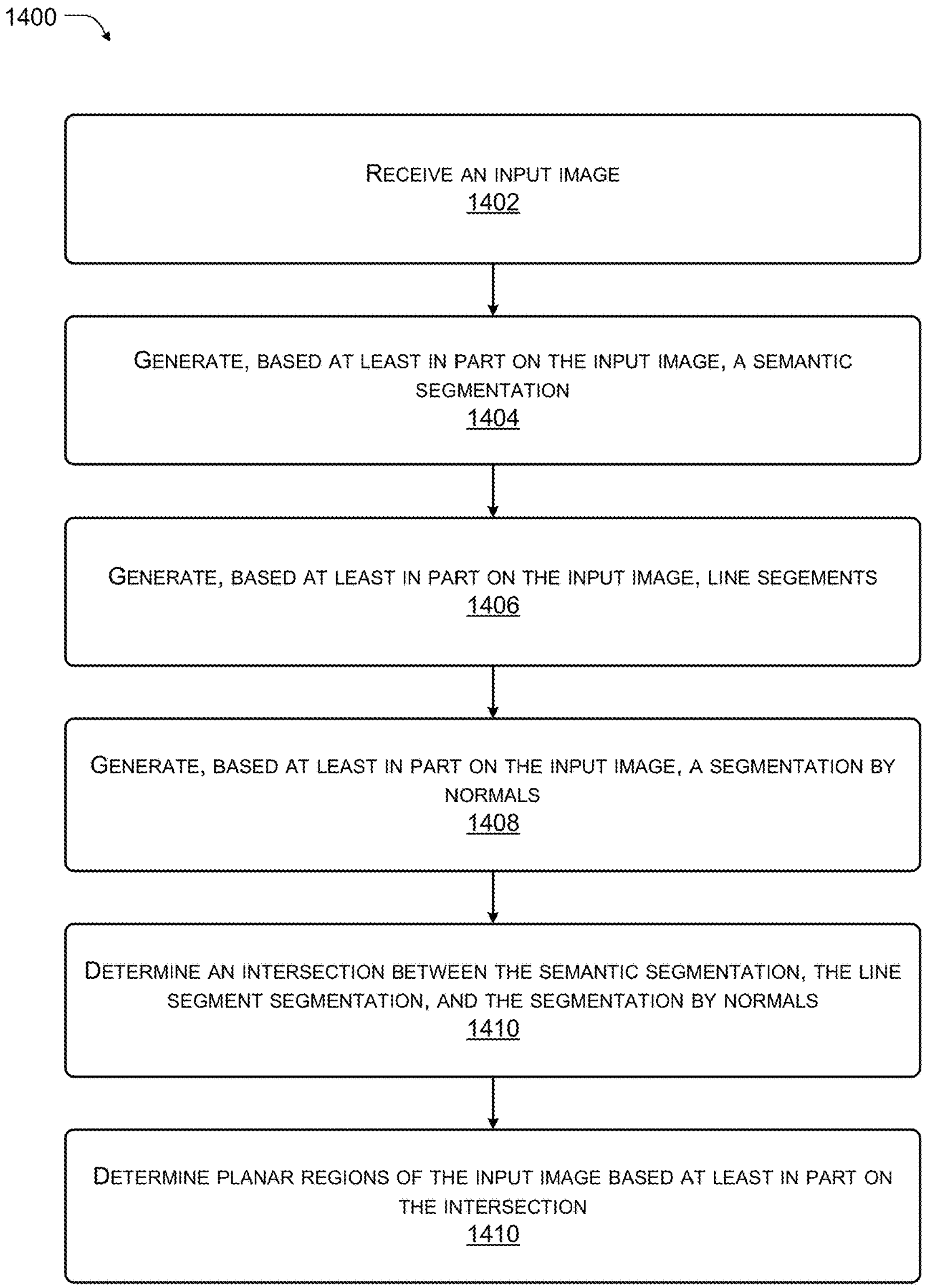
FIG. 14 illustrates an example flow diagram showing a process for determining planar surfaces within a three-dimensional scan according to some implementations.

FIG. 14 illustrates an example flow diagram showing a process 1400 for determining planar surfaces within a three-dimensional scan according to some implementations. For example, in some cases the system may determine surfaces such as walls, ceilings, floors, or object surfaces that are planar when generating a 3D model.

At 1402, the system may receive one or more input image, such as a still image or single frame, representing a physical environment. The input image may be, for instance, one frame of a 3D scan.

At 1404, the system may generate, based at least in part on the input image, semantic segmentation of the image. For example, the system may input the input image into a machine learned model or network and receive out a semantic segmentation, such as identifying walls, floor, as well as objects (e.g., furniture).

At 1406, the system may generate, based at least in part on the input image, line segments of the image. For example, the system may input the input image into a machine learned model or network and receive out a line segments segmentation representing the walls, floor, and objects.

At 1408, the system may generate, based at least in part on the input image, segmentation by normals of the image. For example, the system may input the input image into a machine learned model or network and receive out a color segments that indicating clusters of pixels representing the same object.

At 1410, the system may determine an intersection between the outputs of the semantic segmentation, the line segment segmentation, and the segmentation by normals and, at 1412, the system may determine planar regions of the input image based at least in part on the intersection.

Figure 15:
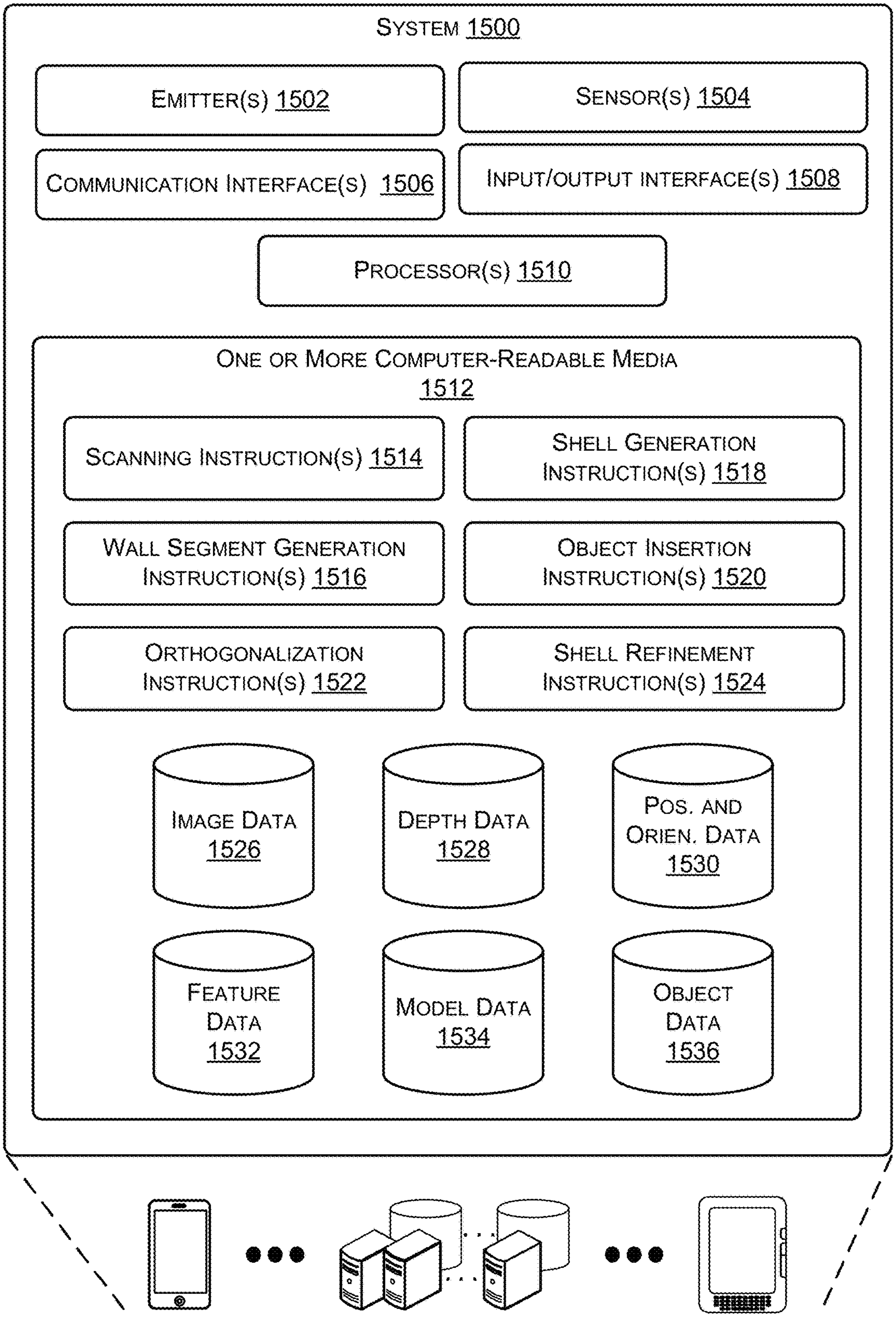
FIG. 15 is an example system for generating two-dimensional floor plans and three-dimensional CAD or architectural models according to some implementations.

FIG. 15 is an example system 1500 for generating three-dimensional models according to some implementations. In some cases, the system 1500 may be a hand-held electronic device equipped with sensors and one or more application for generation and/or aligning 3D models. In other examples, the system 1500 may be a cloud-based service to assist with generating and/or aligning 3D models. In still other examples, the system 1500 may be implemented as a hand-held device in communication with a cloud-based service, such that some of the components and instructions may be stored locally on the hand-held device and other component and/or instructions may be associated with a remote cloud-based service.

In some examples, the system 1500 may include one or more emitters 1502. The emitters 1502 may be mounted on an exterior surface of the device 1500 in order to output illumination or light into a physical environment. The emitters 1502 may include, but are not limited to, visible lights emitters, infrared emitters, ultraviolet light emitters, LIDAR systems, and the like. In some cases, the emitters 1502 may output light in predetermined patterns, varying wavelengths, or at various time intervals (e.g., such as pulsed light).

The system 1500 may also include one or more sensors 1504. The sensor 1504 may include image sensors, depth sensors, motion sensors, position sensors, and the like. For example, the sensors 1504 may include image devices, spectral sensors, IMUs, accelerometers, gyroscopes, depth sensors, infrared sensors, GPS systems, and the like.

The system 1500 may also include one or more communication interfaces 1506 configured to facilitate communication between one or more networks, one or more cloud-based system(s), and/or one or more mobile or user devices.

In some cases, the communication interfaces 1506 may be configured to send and receive sensor data, model data, object data, or the like to one or more cloud-based service as discussed above. The communications interfaces(s) 1506 may enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.), satellite communication, dedicated short-range communications (DSRC), or any suitable wired or wireless communications protocol that enables the respective computing device to interface with the other computing device(s).

In the illustrated example, the system 1500 also includes an input and/or output interface 1508, such as a projector, a virtual environment display, a traditional 2D display, buttons, knobs, and/or other input/output interfaces. For instance, in one example, the interfaces 1508 may include a flat display surface, such as a touch screen configured to allow a user of the system 1500 to consume content (such as scanning instructions, 3D models, and the like).

The system 1500 may also include one or more processors 1510, such as at least one or more access components, control logic circuits, central processing units, or processors, as well as one or more computer-readable media 1512 to perform the function associated with the virtual environment. Additionally, each of the processors 1510 may itself comprise one or more processors or processing cores.

Depending on the configuration, the computer-readable media 1512 may be an example of tangible non-transitory computer storage media and may include volatile and non-volatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, CD-ROM, digital versatile disks (DVD) or other optical storage, magnetic cassettes, magnetic tape, solid state storage, magnetic disk storage, RAID storage systems, storage arrays, network attached storage, storage area networks, cloud storage, or any other medium that can be used to store information and which can be accessed by the processors 1510.

Several modules such as instructions, data stores, and so forth may be stored within the computer-readable media 1512 and configured to execute on the processors 1510. For example, as illustrated, the computer-readable media 1512 may include scanning instructions 1514, wall segment generation instructions 1516, orthogonalization instructions 1522, shell generation instructions 1518, object insertion instructions 1520, shell refinement instructions 1524 as well as other instructions. The computer-readable media 1512 may also store data such as image data 1526, depth data 1528, position and orientation data 1530, feature or object data 1532 (segmented and/or classified data), model data 1534 (e.g., 2D and 3D models), and object data 1536 (CAD models of objects, such as furniture).

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A method comprising:

receiving image data associated with a physical environment;

generating, based at least in part on the image data, a semantic segmentation;

generating, based at least in part on the image data, a line segment segmentation;

determining an intersection based at least in part on the semantic segmentation and the line segment segmentation; and determining, based at least in part on the intersection, a planar surface associated with the physical environment.

2. The method as recited in claim 1, further comprising:

generating, based at least in part on the image data, a segmentation by normals; and wherein:

determining the intersection is based at least in part on the segmentation by normals.

3. The method as recited in claim 2, wherein:

generating the semantic segmentation further comprises inputting the image data into one or more first machine learned models and receiving as an output the semantic segmentation, the one or more first machine learned models trained on first image data of interiors of physical environments including various surfaces and objects;

generating the line segment segmentation further comprises inputting the image data into one or more second machine learned models and receiving as an output the semantic segmentation, the one or more second machine learned models trained on second image data of interiors of physical environments including various surfaces and objects; and generating the segmentation by normals further comprises inputting the image data into one or more third machine learned models and receiving as an output the segmentation by normals, the one or more third machine learned models trained on third image data of interiors of physical environments including various surfaces and objects.

4. The method as recited in claim 1, further comprising generating a three-dimensional model of the physical environment based at least in part on the planar surface.

5. A method comprising:

receiving a model associated with a physical environment, the physical environment representing an interior of a room;

identifying, based at least in part on the model, two or more unconnected endpoints associated with the model;

generating, based at least in part on the two or more unconnected endpoints, pairs of unconnected endpoints;

generating, for each pair of unconnected endpoints, one or more variant line segments;

generating, for each of the one or more variant line segments, a response value score;

selecting, based at least in part on the response value score for each of the one or more variant line segments, a first variant line segment; and completing, based at least in part on the first variant line segment, the model associated with the physical environment.

6. The method as recited in claim 5, wherein identifying the two or more unconnected endpoints further comprises identifying endpoints that are coupled to only one surface segment.

7. The method as recited in claim 5, wherein generating the response value score for each of the one or more variants is based at least in part on a heatmap associated with the physical environment.

8. The method as recited in claim 7, wherein the heatmap is at least one of:
a contour heatmap;
a surface segment heatmap;
an inside heatmap or mask;
or
an outline heatmap.

9. The method as recited in claim 5, further comprising:
discarding at least one of the one or more variant line segments responsive to determining, for at least one of the one or more variant line segments, an intersection between the at least one of the one or more variant line segments and an existing segment of the model.

10. The method as recited in claim 9, further comprising:
determining each of the one or more variant line segments was discarded;
generating, based at least in part on the unconnected endpoints and connected endpoints, additional variant line segments;
generating, for each of the additional variant line segments, a response value score; and
wherein selecting the first variant line segment is based at least in part on the response value score for the additional variant line segments.

11. The method as recited in claim 5, further comprising:
receiving a heatmap associated with the physical environment;
generating a weighted histogram of angles between each line segment of the model;
determining, based at least in part on the weighted histogram, a direction vector associated with a two-dimensional representation of the model; and
performing, based at least in part on the direction vector, orthogonalization of the surface segments of the model.

12. The method as recited in claim 11, wherein determining the direction vector associated with a two-dimensional representation of the model further comprises determine a selected angle based at least in part on the weighted histogram and generating the direction vector based at least in part on the selected angle.

13. The method as recited in claim 11, wherein the weighted histogram is based at least in part on a length of each line segment of the model.

14. A method comprising:
receiving a model associated with a physical environment, the physical environment representing an interior of a room;
determining a trusted segment of the model;
identifying a first segment of the model, the first segment different than the trusted segment;
generating, for the first segment, one or more variant segments, each of the one or more variant segments either parallel or orthogonal to the trusted segment; and
determining a selected variant segment of the one or more variant segments for use in a surface segment of the model; and
generating the surface segment of the model based at least in part on the selected variant segment.

15. The method as recited in claim 14, wherein generating the one or more variant segments for the first segment further comprises rotating the first segment around an endpoint of the first segment.

16. The method as recited in claim 14, wherein determining the selected variant segment of the one or more variant segments further comprises:
receiving a heatmap associated with the physical environment;
determining, based at least in part on the heatmap, a score associated with each of the one or more variant segments; and
selecting, based at least in part on the score associated with individual ones of the one or more variant segments, the selected variant segment.

17. The method as recited in claim 14, wherein determining a trusted segment of the model further comprise selecting a longest line segment of the model as the trusted segment.

18. The method as recited in claim 17, further comprising:
receiving a binary mask associated with the physical environment;
determining, based at least in part on the binary mask, the longest segment;
extending each segment of the model to intersect another segment;
determining unconnected endpoints; and
connecting the unconnected endpoints with an L-shaped segment.

19. The method as recited in claim 18, wherein adjusting the direction or the angle of the other segments of the model is based at least in part on a directional vector of the longest segment or causes each of the other segments to align parallel or orthogonal to the longest segment.

20. The method as recited in claim 18, wherein connecting the unconnected endpoints with an L-shaped segment is prior to determining the selected variant segment.

* * * * *